US010937806B2

(12) United States Patent
Tao et al.

(10) Patent No.: US 10,937,806 B2
(45) Date of Patent: Mar. 2, 2021

(54) THROUGH ARRAY CONTACT (TAC) FOR THREE-DIMENSIONAL MEMORY DEVICES

(71) Applicant: Yangtze Memory Technologies Co., Ltd., Hubei (CN)

(72) Inventors: Qian Tao, Hubei (CN); Yushi Hu, Hubei (CN); Zhenyu Lu, Hubei (CN); Li Hong Xiao, Hubei (CN); Xiaowang Dai, Hubei (CN); Yu Ting Zhou, Hubei (CN); Zhao Hui Tang, Hubei (CN); Mei Lan Guo, Hubei (CN); ZhiWu Tang, Hubei (CN); Qinxiang Wei, Hubei (CN); Qianbing Xu, Hubei (CN); Sha Sha Liu, Hubei (CN); Jian Hua Sun, Hubei (CN); EnBo Wang, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/867,404

(22) Filed: May 5, 2020

(65) Prior Publication Data
US 2020/0266211 A1 Aug. 20, 2020

Related U.S. Application Data

(63) Continuation of application No. 16/047,182, filed on Jul. 27, 2018, now Pat. No. 10,658,378, which is a
(Continued)

(51) Int. Cl.
*H01L 29/792* (2006.01)
*H01L 27/11582* (2017.01)
(Continued)

(52) U.S. Cl.
CPC .. *H01L 27/11582* (2013.01); *H01L 21/76802* (2013.01); *H01L 21/76831* (2013.01);
(Continued)

(58) Field of Classification Search
CPC ......... H01L 27/11524; H01L 27/11529; H01L 27/11578–11582; H01L 27/1157;
(Continued)

(56) References Cited

U.S. PATENT DOCUMENTS 8,247,895 B2 8/2012 Haensch et al.
9,530,789 B2 12/2016 Lee et al.
(Continued)

FOREIGN PATENT DOCUMENTS

CN 105047668 A 11/2015
CN 105826323 A 8/2016
(Continued)

OTHER PUBLICATIONS

International Search Report and Written Opinion of the International Searching Authority directed to related International Patent Application No. PCT/CN2018/085421, dated Jan. 30, 2019; 9 pages.

*Primary Examiner* — Calvin Y Choi
(74) *Attorney, Agent, or Firm* — Sterne, Kessler, Goldstein & Fox P.L.C.C.

(57) ABSTRACT

Embodiments of interconnect structures of a three-dimensional (3D) memory device and method for forming the interconnect structures are disclosed. In an example, a 3D NAND memory device includes a semiconductor substrate, an alternating layer stack disposed on the semiconductor substrate, and a dielectric structure, which extends vertically through the alternating layer stack, on an isolation region of the substrate. Further, the alternating layer stack abuts a sidewall surface of the dielectric structure and the dielectric
(Continued)

structure is formed of a dielectric material. The 3D memory device additionally includes one or more through array contacts that extend vertically through the dielectric structure and the isolation region, and one or more channel structures that extend vertically through the alternating layer stack.

20 Claims, 15 Drawing Sheets

Related U.S. Application Data continuation of application No. PCT/CN2018/085421, filed on May 3, 2018.

(51) Int. Cl.
*H01L 21/768* (2006.01)
*H01L 23/522* (2006.01)
*H01L 27/11565* (2017.01)
*H01L 27/1157* (2017.01)

(52) U.S. Cl.
CPC .... *H01L 21/76877* (2013.01); *H01L 23/5226* (2013.01); *H01L 27/1157* (2013.01); *H01L 27/11565* (2013.01)

(58) Field of Classification Search
CPC ........ H01L 27/11551–11556; H01L 29/40114; H01L 29/40117; H01L 21/0223; H01L 27/11582; H01L 27/11573; H01L 21/76802; H01L 21/76877; H01L 23/5226

USPC .......................................................... 257/324
See application file for complete search history.

(56) References Cited

U.S. PATENT DOCUMENTS

| | | |
|---|---|---|
| 9,595,531 B2 | 3/2017 | Zhu et al. |
| 9,595,667 B2 | 3/2017 | Pio |
| 9,620,512 B1 | 4/2017 | Nishikawa et al. |
| 9,659,956 B1* | 5/2017 | Pachamuthu ..... H01L 27/11529 |
| 2016/0056188 A1 | 2/2016 | Lee et al. |
| 2016/0071861 A1 | 3/2016 | Serov et al. |
| 2017/0179026 A1 | 6/2017 | Toyama et al. |
| 2017/0186758 A1* | 6/2017 | Lee ........................ G11C 16/10 |
| 2017/0358593 A1 | 12/2017 | Yu et al. |
| 2017/0365613 A1* | 12/2017 | Gunji-Yoneoka ........................... H01L 27/11524 |
| 2019/0057974 A1 | 2/2019 | Lu et al. |
| 2019/0341399 A1 | 11/2019 | Tao |

FOREIGN PATENT DOCUMENTS

| | | |
|---|---|---|
| CN | 106910746 A | 6/2017 |
| CN | 106920794 A | 7/2017 |
| CN | 107887395 A | 4/2018 |
| TW | 201419449 A | 5/2014 |
| TW | 201606388 A | 2/2016 |
| TW | 201721921 A | 6/2017 |
| WO | WO 2019/104896 A1 | 6/2019 |

\* cited by examiner

THROUGH ARRAY CONTACT (TAC) FOR THREE-DIMENSIONAL MEMORY DEVICES

CROSS-REFERENCES TO RELATED APPLICATIONS

This application is a continuation of U.S. patent application Ser. No. 16/047,182, titled "Through Array Contact (TAC) for Three-dimensional Memory Devices," filed on Jul. 27, 2018, which claims the priority of PCT Patent Application No. PCT/CN2018/085421 filed on May 3, 2018, both of which are incorporated herein by reference in their entireties.

TECHNICAL FIELD

The present disclosure generally relates to the field of semiconductor technology, and more particularly, to a channel hole plug structure of three-dimensional (3D) memory devices and a method for forming the same.

BACKGROUND

Planar memory cells have been continuously scaled down from one technology generation to the next by improvements in circuit design, fabrication integration, and fabrication process. However, as the feature sizes of the memory cells continuously shrink, the density for planar memory cells increases. Consequently, the fabrication techniques can become challenging and costly.

A three-dimensional (3D) memory architecture (e.g., planar memory cells stacked on top of each other) can address the density limitation of planar memory cells. The 3D memory architecture includes a memory array and peripheral devices for controlling signals to and from the memory array.

BRIEF SUMMARY

Embodiments of 3D memory and fabrication methods thereof are disclosed herein.

According to some embodiments of the present disclosure, a 3D NAND memory device includes an alternating layer stack with a staircase structure and one or more dielectric structures surrounded by the alternating layer stack. The alternating layer stack can include a stack of alternating conductor and dielectric layers, and the dielectric structures can include a single dielectric layer. The memory device further includes multiple vertical structures that extend vertically through the alternating conductor/dielectric stack, and multiple vertical structures that extend vertically through the dielectric structures. By way of example and not limitation, vertical structures extending vertically through the alternating conductor/dielectric stack can include "channel" structures and "slit" structures. Vertical structures extending vertically through the dielectric structures can include through array contact structures, referred to herein as "through array contacts" ("TAC" structures or "TACs").

Additional elements of the 3D NAND memory device can include an etch stop layer disposed on each channel structure and a first contact layer with a plurality of first contacts. For example, each of the first contacts can be formed to physically connect to a respective conductor layer from each alternating conductor/dielectric stack in the staircase structure, a respective etch stop layer of the channel structures, and a respective slit structure.

In some embodiments, the etch stop layer includes polysilicon (e.g., polycrystalline silicon or "poly"), titanium (Ti), titanium nitride (TiN), tungsten (W), or combinations thereof. Further each of the plurality of conductor/dielectric layer pairs can include a metal and a silicon oxide ($SiO_2$) layer. The aforementioned materials are exemplary and are not limiting. As such, other appropriate materials can be used.

In some embodiments, the memory device includes dummy (e.g., electrically non-functional) channel structures extending vertically through the alternating conductor/dielectric stack.

In some embodiments, the memory device includes a second contact layer over the first contact layer and a third contact layer over the second contact layer. The second and third contact layers include respective second and third contacts. Some contacts of the third contact layer, via the respective second and first contacts, are electrically connected to the conductor layers from the alternating conductor/dielectric stack in the staircase structure, and to the channel and slit structures. In some embodiments, the first, second and third contact layers form an interconnect network for the 3D NAND memory device. The interconnect network can be used to transfer electrical signals between the various components of the 3D NAND memory device.

According to some embodiments of the present disclosure, a method for forming a 3D NAND memory device is disclosed herein. For example, an alternating dielectric stack can be formed over a substrate. The alternating dielectric stack can include a plurality of dielectric layer pairs, where each pair includes a first dielectric layer and a second dielectric layer different from the first dielectric layer. A first staircase structure can be subsequently formed in the alternating dielectric stack. Subsequently, channel structures and a dielectric structure—each extending vertically through the alternating dielectric stack—are formed.

In some embodiments, the dielectric material of the dielectric structure can be the same as the material of the second dielectric layer in the alternating dielectric stack. A sacrificial etch stop layer can be disposed on each channel structure. Slit openings extending through the alternating dielectric stack are subsequently formed and the first dielectric layers of the alternating dielectric stack are replaced with conductor layers through the slit openings to form a plurality of conductor/dielectric layer pairs. The slit openings are then filled with a conductor material. Further, a first contact layer with a plurality of first contacts can be formed so that each first conductor layer from the alternating conductor/dielectric stack in the first staircase structure is connected to a first contact. Additionally, each channel and slit structure can also be connected to a respective first contact of the first contact layer. In some embodiments, and prior to the formation of the first contact layer, the sacrificial etch stop layer over each channel structure can be replaced with a "permanent" etch stop layer.

In some embodiments, TAC openings are etched through the dielectric structure and subsequently filled with a metal to form respective TAC structures that extend through the dielectric structure and a portion of the substrate. In some embodiments, TAC structures are part of the first contact layer. In other words, the TAC structures can be formed concurrently with the first contact layer.

In some embodiments, a second contact layer with a plurality of second contacts can be formed over the first contact layer. Second contacts can be connected to respective first contacts of the first contact layer.

In some embodiments, a third contact layer with a plurality of third contacts can be formed over the second contact layer. The third contact layer, via the respective second and first contact layers, can electrically connect to the various components of the memory device including the first conductor layers of the alternating conductor/dielectric stack in the first staircase structure, the channel structures, and the slit structures.

In some embodiments, prior to forming the slit structure, a doped region can be formed in the substrate. The slit structure can be in contact with the doped region.

In some embodiments, the permanent etch stop layer includes one or more of polysilicon, titanium, titanium nitride, and tungsten. The dielectric structure can include silicon oxide. Each of the plurality of dielectric layer pairs can include a silicon oxide layer and a silicon nitride layer. Each of the plurality of conductor/dielectric layer pairs can include a metal layer and a silicon oxide layer.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
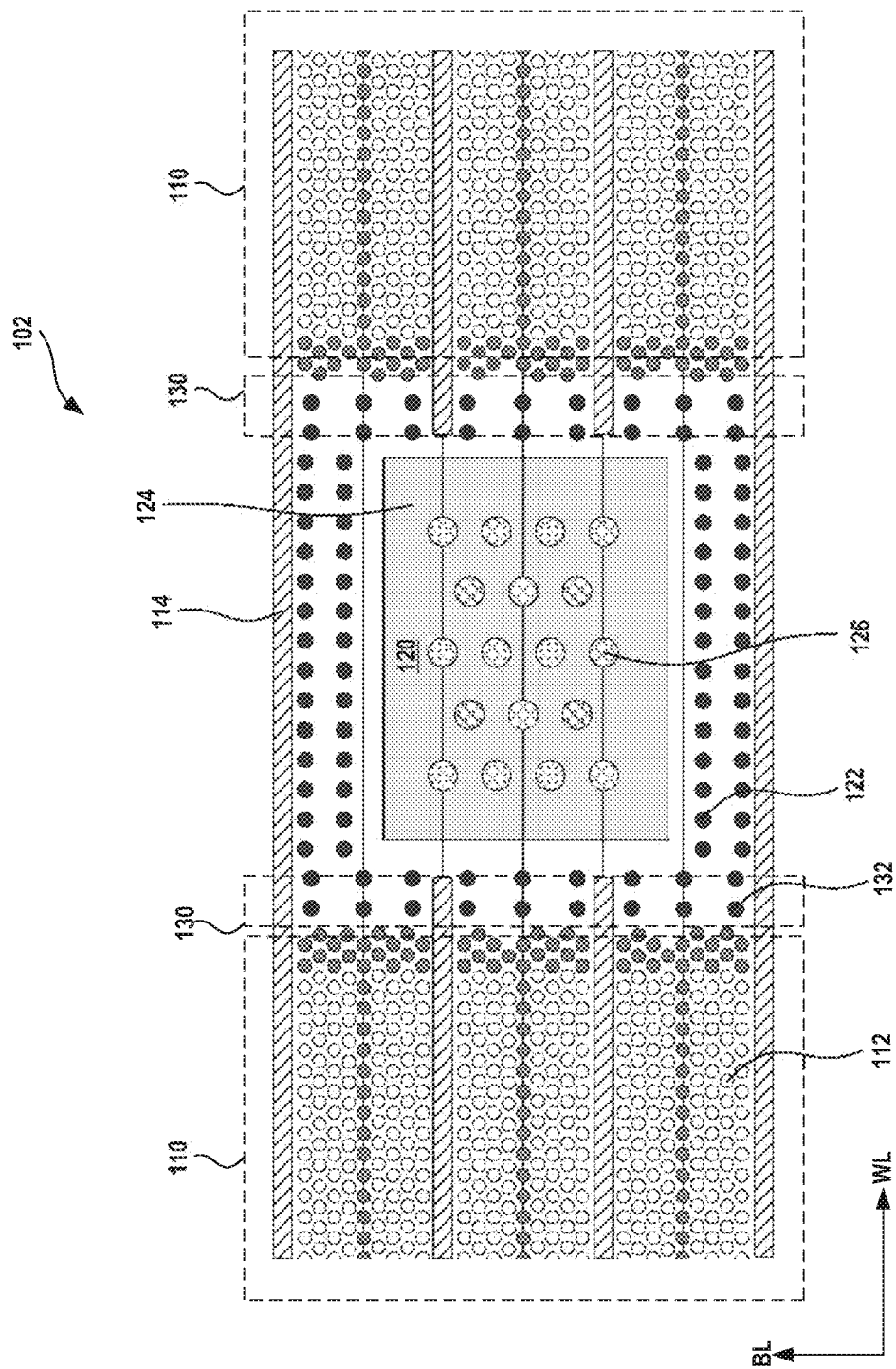
FIGS. 1A-1C illustrate various regions of a 3D memory device in the plan-view, according to some embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

Although specific configurations and arrangements are discussed, it should be understood that this is done for illustrative purposes only. A person skilled in the art will recognize that other configurations and arrangements can be used without departing from the spirit and scope of the present disclosure. It will be apparent to a person skilled in the art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added, or otherwise "disposed." The substrate itself can be patterned. Materials disposed on (e.g., on top) the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. As used herein, the term "top surface" or "front side" of a structure, a layer, or an element refers to a surface where subsequent elements or structures can be formed thereon. Conversely, as used herein, the term "bottom surface" or "backside" refers to the side of the structure, layer, or element that is opposite to the top surface. It is noted that the terms "top surface" or "front side" and "bottom surface" or "backside" are used merely for description purposes and not to limit the orientation of the elements, layers, or structures. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

Various embodiments in accordance with the present disclosure provide a 3D memory device with interconnect structures for a memory array (also referred to herein as an "array device"). The interconnect structures allow contacts to various memory array structures (e.g., NAND strings, gate line slits, word lines, etc.) to be fabricated in a limited number of steps (e.g., in a single step or in two steps), thereby reducing the process complexity and manufacturing cost. In some embodiments, the interconnect structures disclosed herein include bit lines in the top interconnect layer, which are suitable for those 3D memory architectures where the array device and a peripheral device are formed on different substrates and are subsequently joined by hybrid bonding in a "face-to-face" configuration.

Moreover, the interconnect structures disclosed herein can include TAC structures for providing vertical interconnects between the stacked array device and a peripheral device (e.g., for power bus and metal routing), thereby reducing metal levels and shrinking die size. In some embodiments, the TAC structures, as part of the interconnect structures, are formed within "single-material" dielectric structures (e.g., dielectric structures that are made of a single dielectric as opposed to a stack of alternating dielectric layers). According to some embodiment, forming TAC structures in a single-material dielectric structure is advantageous compared to the formation of TAC structures in a stack of alternating dielectric layers in terms of etching capability and cost.

Figure 1B:
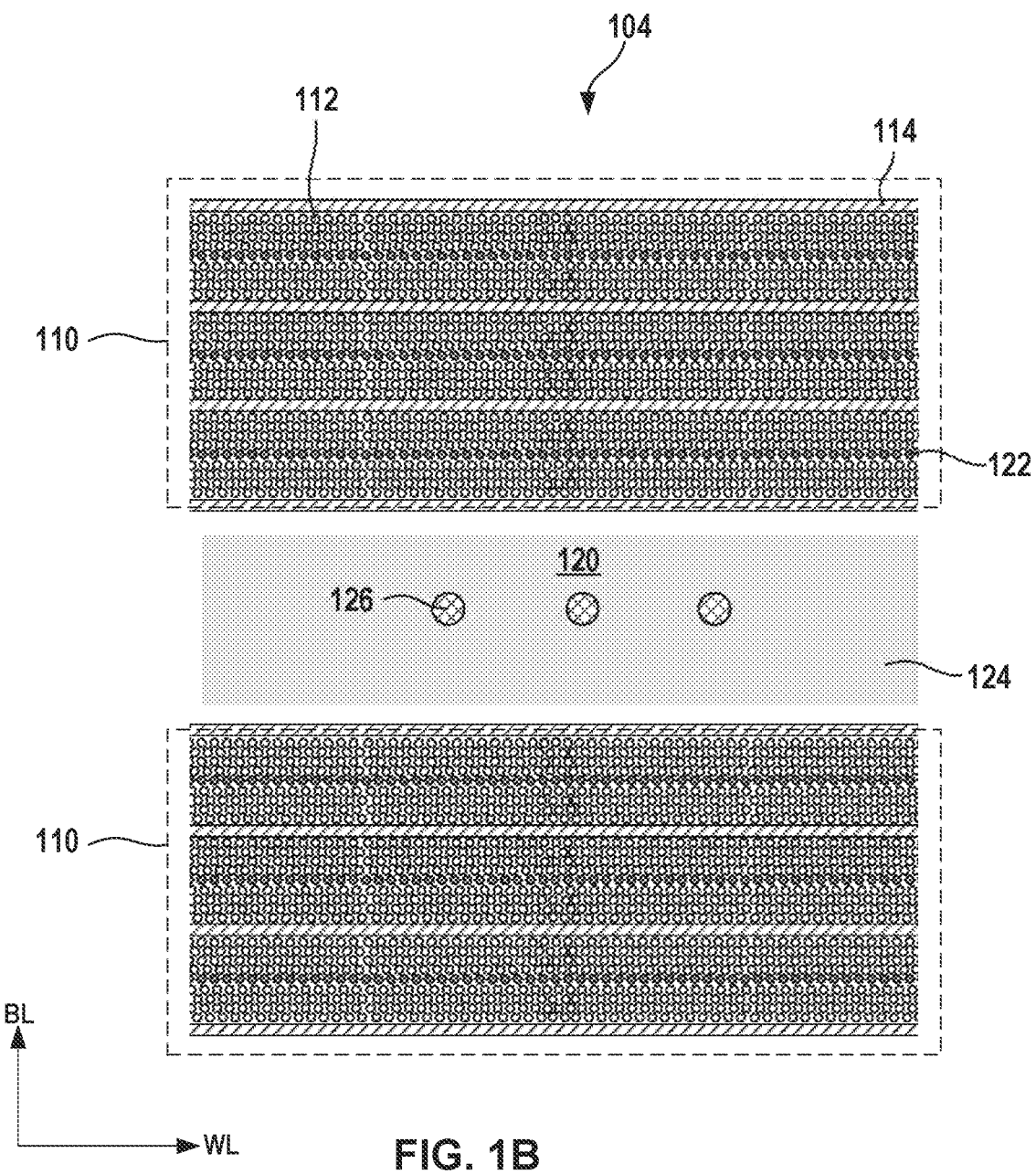
Figure 1C:
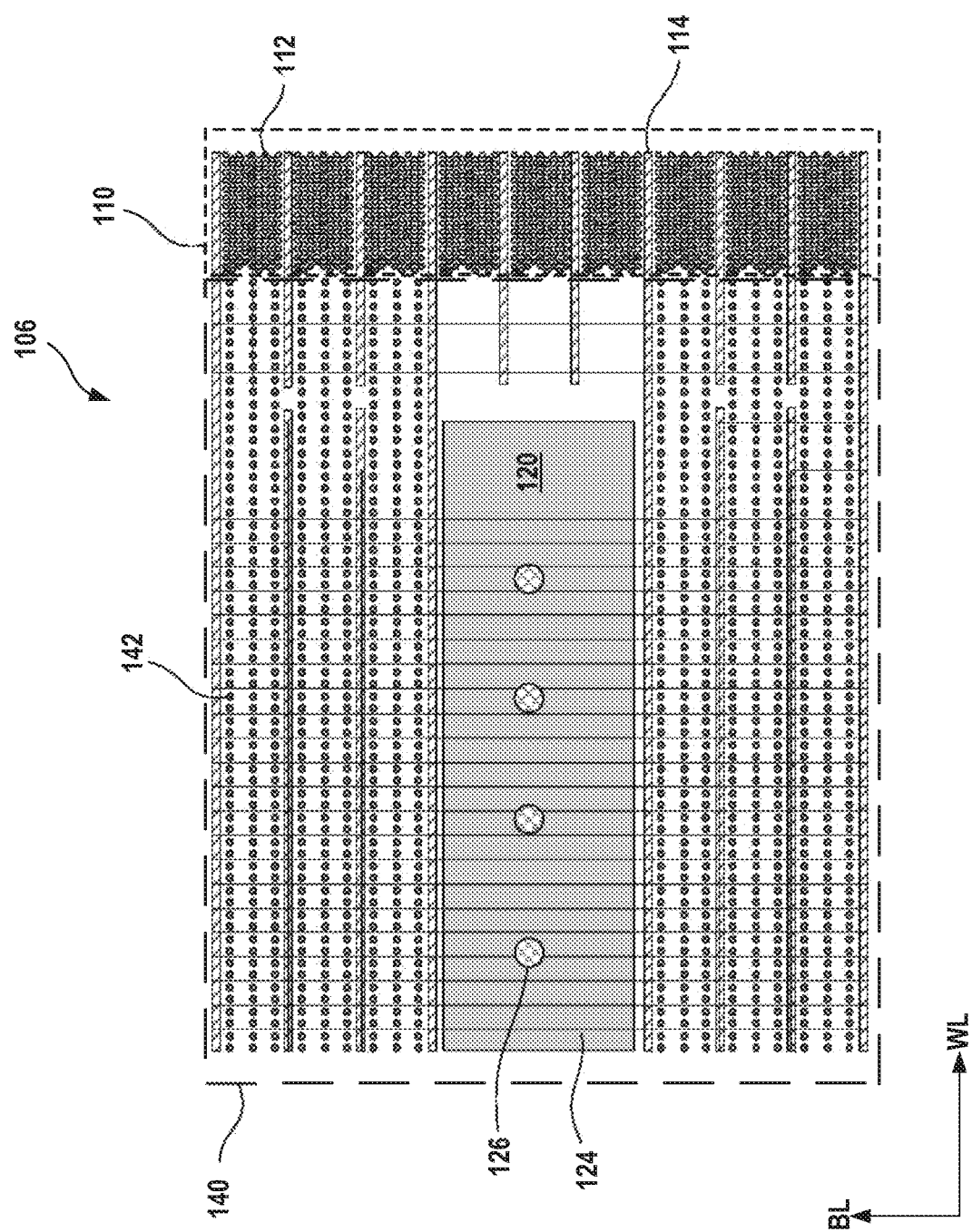

According to some embodiments, FIGS. 1A-1C are plan-views of various exemplary regions of a 3D memory device along a bit line (BL) and a word line (WL) direction as denoted by respective axes labeled BL and WL. For example, FIG. 1A is a plan-view of an exemplary WL TAC region 102 of the 3D memory device. TAC region 102 includes NAND string regions 110, a TAC region 120, and top selective gate (TSG) staircase regions 130. NAND string regions 110 can include an array of NAND strings 112, each including a plurality of stacked memory cells. TSG staircase regions 130 can be disposed on the sides of NAND string regions 110 and adjacent to TAC region 120 in the plan-view. TSG staircase regions 130 can include an array of TSG contacts 132 formed on a staircase structure having two levels or more. TSG contacts 132 can be electrically connected to the top selective gates of NAND strings 112 in NAND string region 110 through a network of interconnect contacts not shown in FIG. 1A.

In some embodiments, TAC region 120 is between two TSG staircase regions 130 in the WL direction of the 3D memory device. TAC region 120 can be defined by a single-material dielectric structure 124. Multiple TAC structures 126 can be formed within TAC region 120 in dielectric structure 124. In some embodiments, dummy (e.g., non-electrically functional) channel structures 122 are formed outside TAC region 120 to provide mechanical support to the memory array structures. By way of example and not limitation, dummy channel structures 122 can be formed in any regions outside TAC region 120, for example, along the edges of NAND string regions 110 adjacent to TSG staircase regions 130. As shown in FIG. 1A, WL TAC region 102 can also include a plurality of slit structures 114 with each extending in the WL direction. At least some slit structures 114 can function as the common source contact for an array of NAND strings 112 in NAND string regions 110. According to some embodiments, slit structures 114 can divide the 3D memory device into multiple memory blocks.

FIG. 1B is a plan-view of an exemplary bit line (BL) TAC region 104 of the 3D memory device, including NAND string regions 110 and a TAC region 120. NAND string regions 110 can include an array of NAND strings 112, each including a plurality of stacked memory cells. In some embodiments, TAC region 120 is disposed between two NAND string regions 110 in the bit line direction of the 3D memory device (labeled as "BL" in FIGS. 1A-1C). TAC region 120 can be defined by a single-material dielectric structure 124. More than one TAC structures 126 can be formed in TAC region 120 within dielectric structure 124, as shown in FIG. 1B. Further, BL TAC region 104 can also include slit structures 114 with each extending in the WL direction. At least some slit structures 114 can function as the common source contact for an array of NAND strings 112 in NAND string regions 110. Slit structures 114 can also divide the 3D memory device into multiple memory blocks. In some embodiments, dummy (e.g., non-electrically functional) channel structures 122 are formed in part of NAND string regions 110, for example, in the memory areas that are adjacent to TAC region 120 in the bit line direction.

FIG. 1C is a plan-view of an exemplary staircase TAC region 106 of the 3D memory device, including a NAND string region 110, a staircase region 140, and a TAC region 120. NAND string region 110 can include an array of NAND strings 112, each including a plurality of stacked memory cells. Staircase region 140 can include a staircase structure and an array of WL contacts 142 formed on the staircase structure. In some embodiments, TAC region 120 can be formed in staircase region 140. TAC region 120 is defined by the single-material dielectric structure 124. Multiple TAC structures 126 can be formed within TAC region 120 in single-material dielectric structure 124. As shown in FIG. 1C, staircase TAC region 106 can also include slit structures 114 with each extending in the WL direction. At least some slit structures 114 can function as the common source contact for an array of NAND strings 112 in NAND string region 110. Slit structures 114 can also divide the memory device into multiple memory blocks. In some embodiments, dummy (e.g., non-electrically functional) channel structures are formed in staircase region 140 outside TAC region 120 (not shown in FIG. 1C).

Figure 2:
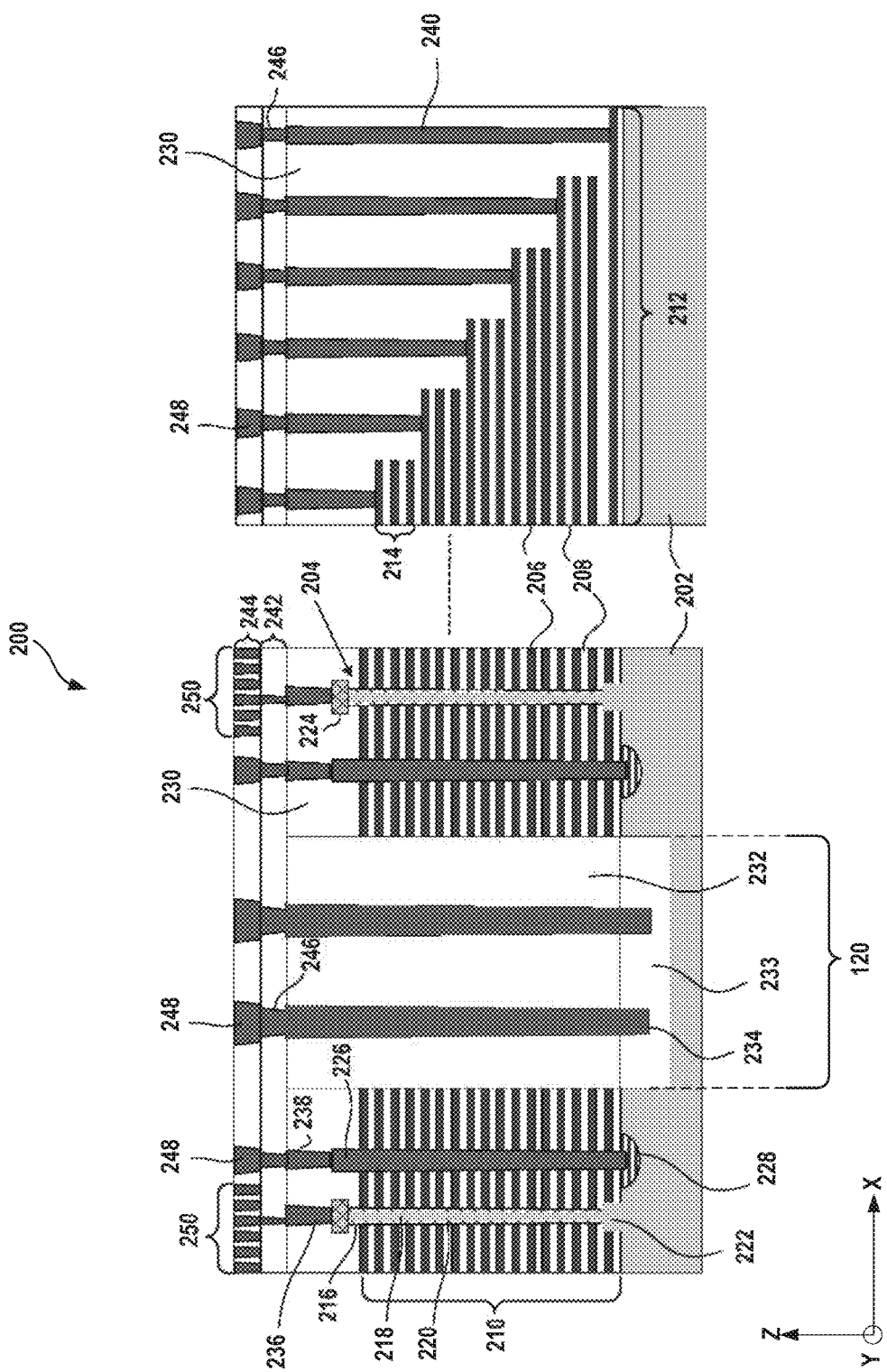
FIG. 2 illustrates a cross-section of a 3D memory device, according to some embodiments of the present disclosure.

FIG. 2 is a cross-sectional view of an exemplary 3D memory device 200, according to some embodiments of the present disclosure. 3D memory device 200 can include a substrate 202. Substrate 202 can include single crystalline silicon (Si) or another elementary semiconductor such as, for example, (i) germanium (Ge); (ii) a compound semiconductor including silicon germanium (SiGe), silicon carbide (SiC), gallium arsenide (GaAs), gallium phosphide (GaP), indium phosphide (InP), indium arsenide (InAs), and/or indium antimonide (InSb); (iii) an alloy semiconductor including gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof. Further, substrate 202 can be a "semiconductor-on-insulator" wafer, such as silicon on insulator (SOI) or germanium on insulator (GOI). For example purposes, substrate 202 will be described in the context of single crystalline Si (e.g., a Si wafer). Based on the disclosure herein, other materials, as discussed above, can be used. These materials are within the spirit and scope of this disclosure. In some embodiments, substrate 202 can be a thinned substrate, which was thinned by means of grinding, wet and/or dry etching, chemical mechanical planarization (CMP), or a combination thereof.

3D memory device 200 can include an array device above substrate 202 (on a top surface of substrate 202). It is noted that x, y, and z axes are added in FIG. 2 to further illustrate the spatial relationship between the various components in 3D memory device 200. Substrate 202 includes two lateral surfaces (e.g., a top surface and a bottom surface) extending laterally in the x-direction (the lateral direction) and y-direction. As used herein, whether one component (e.g., a layer or a device) is "on," "above," or "below" another component (e.g., a layer or a device) of a semiconductor device (e.g., 3D memory device 200) is determined relative to substrate 202 in the z-direction (the vertical direction) when the substrate is positioned in the lowest plane of the semiconductor device in the z-direction. The same notion for describing spatial relationship is applied throughout the present disclosure. Further, the y-direction is pointing into the page of FIG. 2.

By way of example and not limitation, 3D memory device 200 can be part of a non-monolithic 3D memory device, in which components (e.g., the peripheral device and array device) can be fabricated independently on different substrates and then bonded in a "face-to-face" configuration. In some embodiments, the array device substrate (e.g., substrate 202) remains as the substrate of the bonded non-monolithic 3D memory device, and the peripheral device (e.g., any suitable digital, analog, and/or mixed-signal peripheral circuits used for facilitating the operation of 3D memory device 200, such as page buffers, decoders, and latches; not shown in FIG. 2) is positioned so that it faces the 3D memory device 200 prior to hybrid bonding. Alternatively, in some embodiments, 3D memory device 200 is positioned so that it faces the peripheral device (not shown in FIG. 2 merely for clarity) prior to hybrid bonding. The array device substrate (e.g., substrate 202) can be a thinned substrate and the back-end-of-line (BEOL) interconnects of the non-monolithic 3D memory device can be formed on the backside (e.g. bottom surface) of the thinned array device substrate 202.

In some embodiments, 3D memory device 200 can be part of a non-monolithic 3D memory device regardless of its relative position (e.g. above or below) with respect to the peripheral device. For ease of reference, FIG. 2 depicts a state of 3D memory device 200 in which substrate 202 (the array device substrate) is positioned below the array device in the x-y plane, regardless of whether substrate 202 is the substrate of the non-monolithic 3D memory device or a thinned substrate on which the BEOL interconnect layers of the non-monolithic 3D memory device are formed.

In some embodiments, 3D memory device 200 is a NAND Flash memory device in which memory cells are provided in the form of an array of NAND strings 204 extending vertically above substrate 202. The array device can include a plurality of NAND strings 204 that extend through a plurality of conductor layer 206 and dielectric layer 208 pairs. The plurality of conductor/dielectric layer pairs are also referred to herein as "alternating conductor/dielectric stack" 210. In some embodiments, the number of the conductor/dielectric layer pairs in alternating conductor/dielectric stack 210 (e.g., 32, 64, or 96) defines the number of memory cells in 3D memory device 200. Conductor layers 206 and dielectric layers 208 in alternating conductor/dielectric stack 210 alternate in the vertical direction (e.g., along the z-axis). In other words, except the layers at the top or bottom of alternating conductor/dielectric stack 210, each conductor layer 206 can be adjoined by two dielectric layers 208 on both sides, or each dielectric layer 208 can be adjoined by two conductor layers 206 on both sides. Conductor layers 206 can each have the same thickness or different thicknesses. Similarly, dielectric layers 208 can each have the same thickness or different thicknesses. By way of example and not limitation, the thickness of each conductor layer 206 can range from about 25 nm to about 40 nm, and the thickness of each dielectric layer 208 can range from about 20 nm to about 35 nm.

By way of example and not limitation, conductor layers 206 can include conductive materials such as tungsten (W), cobalt (Co), copper (Cu), aluminum (Al), doped polycrystalline Si (polysilicon), doped single crystalline Si, silicides, or any combination thereof. Dielectric layers 208 can include dielectric materials including, but not limited to, silicon oxide ($Si_xO_y$, thereafter "$SiO_2$"), silicon nitride ($Si_xN_y$, thereafter "SiN"), silicon oxynitride (SiON), or any combination thereof. In some embodiments, conductor layers 206 include metal layers, such as W, and dielectric layers 208 include $SiO_2$.

As shown in FIG. 2, at least on one side in the lateral direction (e.g., along the x-axis), alternating conductor/dielectric stack 210 can include a staircase structure 212. Each "level" or "step" 214 of staircase structure 212 can include one or more conductor/dielectric layer pairs on stacked top of each other. Each conductor/dielectric layer pair includes a conductor layer 206 and dielectric layer 208 respectively. The top layer in each level 214 of staircase structure 212 is a conductor layer 206 available for interconnection in the vertical direction (e.g., along the z-axis). In some embodiments, levels 214 in staircase structure 212 have the same height. Further, adjacent levels 214 of staircase structure 212 are being offset with one another by a nominally same distance in the x-direction. More specifically, for each two adjacent levels 214 of staircase structure 212, the first level that is closer to substrate 202 can extend laterally further than the second level, thereby forming a "landing area" or a "connection point" on the first level for interconnection in the vertical direction (e.g., along the z-axis).

As shown in FIG. 2, each NAND string 204 includes a channel structure 216 that extends through alternating conductor/dielectric stack 210. Channel structure 216 is filled with semiconductor materials (e.g., as a semiconductor channel 218) and dielectric materials (e.g., as a memory film 220). In some embodiments, semiconductor channel 218 includes Si, such as amorphous Si, polysilicon, single crystalline Si, etc. In some embodiments, memory film 220 is a composite stack of layers that includes a tunneling layer, a storage layer (also known as "charge trap/storage layer"), and a blocking layer. Each NAND string 204 can have a cylindrical shape (e.g., a pillar shape). Semiconductor channel 218, the tunneling layer, the storage layer, and the blocking layer are arranged along a direction from the center toward the outer surface of the pillar in this order, according to some embodiments. The tunneling layer can include $SiO_2$, SiN, or any combination thereof. The storage layer can include SiN, SiON, silicon, or any combination thereof. The blocking layer can include $SiO_2$, SiN, high dielectric constant (high-k) dielectrics (e.g., with a dielectric constant greater than 3.9), or any combination thereof.

In some embodiments, NAND strings 204 include a plurality of control gates (each being part of a WL). Conductor layer 206 in alternating conductor/dielectric stack 210 can act as the control gate for memory cells in NAND strings 204. Additionally, each conductor layer 206 can act as the control gate for multiple NAND strings 204 that can extend laterally (e.g., along the x-y plane) as a WL ending in staircase structure 212.

In some embodiments, each NAND string 204 includes an epitaxial layer 222 and an etch stop plug 224 at the respective bottom and top of NAND string 204, as shown in FIG. 2. For each NAND string 204, epitaxial layer 222 is referred to herein as an "epitaxial plug." Each of epitaxial plug 222 and etch stop plug 224 can be in contact with a respective end of channel structure 216. Epitaxial plug 222 can include, for example, a semiconductor material (e.g., single crystalline Si) that is epitaxially grown from substrate 202. Etch stop plug 224 can include semiconductor materials (e.g., polysilicon) or conductor materials (e.g., metals). In some embodiments, etch stop plug 224 includes an opening filled with a titanium/titanium nitride stack (barrier and adhesion layer) and W (conductor). As the name suggests, etch stop plug 224 is an etch stop layer that prevents etching of dielectrics in channel structure 216, such as $SiO_2$ and SiN, during subsequent etch operations. In some embodiments, etch stop plug 224 acts as the drain of NAND string 204.

In some embodiments, the array device further includes slit structures 226. Each slit structure 226 can extend vertically (e.g., along the z-axis) through alternating conductor/dielectric stack 210. Slit structures 226 also extend along the y-axis to separate alternating conductor/dielectric stack 210 into multiple blocks as discussed earlier for FIGS. 1A-1C. Slit structures 226 are filled with conductor materials including, but not limited to, W, Co, Cu, Al, a silicide, or any combination thereof. Slit structures 226 further include a dielectric layer interposed between the conductor in slit structure 226 and alternating conductor/dielectric stack 210 to electrically insulate the conductor materials in the slit structure from the surrounding conductor layers in alternating conductor/dielectric stack 210. In some embodiments, slit structure 226 acts as the source contact for NAND strings 204 located in the same memory block. Consequently, a slit structure 226 can function as the "common source contact" of multiple NAND strings 204 within a memory block.

In some embodiments, substrate 202 includes doped regions 228 with p-type or n-type dopants at a desired doping level. Each doped region 228 is in contact with a respective slit structure 226, as shown in FIG. 2. In some embodiments, slit structures 226 are electrically coupled to NAND strings 204 through doped regions 228.

It has to be noted that NAND strings 204 and slit structures 226 are partially formed in a dielectric layer 230 that is disposed over alternating conductor/dielectric stack 210. In some embodiments, dielectric layer 230 can be a layer stack made of a single dielectric material—as opposed to being a stack of alternating dielectric layers. By way of example and not limitation, dielectric layer 230 is an oxide layer, such as $SiO_2$. In other words, dielectric layer 230 can be the same as dielectric layer 208. Further, and as shown in FIG. 2, dielectric layer 230 can extend over staircase structure 212.

As shown in FIG. 2, dielectric conductor/dielectric stack 210 is "disrupted" by single-material dielectric structure 232 (thereafter "dielectric structure 232") along the x-direction (and along the y-direction—not shown from FIG. 2). In some embodiments, dielectric structure 232 defines the boundaries, the shape, and the size of TAC region 120 (e.g., shown in FIGS. 1A-1C). Consequently, as shown in the plan-views of FIGS. 1A-1C, dielectric structure 232 can be surrounded by conductor/dielectric stack 210. Further, dielectric structure 232 can extend in the x-y plane and be coplanar with dielectric layer 230 (e.g., the top surfaces of dielectric structure 232 and dielectric layer 230 are flushed). In some embodiments, dielectric structure 232 is formed so that it is aligned to or covers at least a portion of an underlying isolation structure or region 233 (thereafter "shallow trench isolation (STI) structure 233). Please note that, STI structure 233 is exemplary and is not limiting. As such, other isolation structures can be used. Further, dielectric structure 232 is in contact with STI structure 233. By way of example and not limitation, STI structure 233 is formed on a top portion of substrate 202 and is filled with a dielectric material, including but not limited to $SiO_2$, for example. In some embodiments, the footprint of dielectric structure 232 is smaller or equal to the footprint of STI structure 233. For example, in some embodiments, dielectric structure 232 can cover only portion of STI structure 233.

In some embodiments, dielectric structure 232 includes the same material with dielectric layer 230, and/or dielectric layer 208. For example, dielectric structure 232 can include $SiO_2$. However, this is not limiting and therefore dielectric structure 232 can include a different material than dielectric layer 208 or dielectric layer 230. In some embodiments, dielectric structure 232 can have different shapes. For example, as shown in the plan-views of FIGS. 1A-1C, TAC region 120 can have a rectangle or square shape. However, these shapes are not limiting and dielectric structures 232 can have any shape according to a design layout. Further, multiple dielectric structures, like dielectric structure 232, are possible across substrate 202.

As shown in FIG. 2, 3D memory device 200 further includes TACs 234, which extend vertically through dielectric structure 232. According to some embodiments, etching through dielectric structure 232 can be advantageous (e.g., involve fewer etch operations) compared to etching through a stack of alternating layers having the same overall thickness. For example, the formation of TACs 234 in an alternating layer stack with a thickness of about 6 μm or more (e.g., for a 64 tier 3D memory device) requires multiple etch and fill operations—therefore, increases the fabrication cost. Each TAC 234 can extend through the entire thickness of dielectric structure 232 and extend through at least a portion of STI structure 233 in substrate 202.

TACs 234 can carry electrical signals from and/or to 3D memory device 200, such as part of the power bus, with shorten interconnect routing. In some embodiments, TACs 234 can provide electrical connections between 3D memory device 200 and the peripheral device (e.g., on a CMOS chip; not shown in FIG. 2) and/or between BEOL interconnects (not shown in FIG. 2) and the peripheral device. Each TAC 234 is filled with conductor materials, including, but not limited to, W, Co, Cu, Al, doped Si, silicides, or any combination thereof. Since TACs 234 are embedded in dielectric structure 232, additional layers of dielectric are not required to insulate the conductor material.

In some embodiments, 3D memory device 200 includes a plurality of "local contacts" in physical and electrical contact with the various memory array structures disclosed herein, such as NAND strings 204, slit structures 226, and conductor layers or WL 206 in staircase structure 212. The contacts are referred to herein as "local contacts" because they are in direct contact with the memory array structures, and further because they are formed within dielectric layer 230. As shown in FIG. 2, local contacts can include NAND string contacts 236, slit structure contacts 238, and WL contacts 240. In some embodiments, TACs 234 are also considered local contacts. As used herein, the term "contact" can broadly include any suitable types of interconnects including vertical interconnect access (via) lines and lateral lines (interconnect lines).

In some embodiments, each local contact is coplanar with one another, e.g., on the top surface of a dielectric layer 230 (and dielectric structure 232 for TACs 234) in which the local contacts are formed. The lower end of each local contact can be in direct contact with the respective memory array structure. For example, the lower end of NAND string contact 236 can be in contact with etch stop plug 224 of NAND string 204, and the lower end of slit structure contact 238 can be in contact with the upper end of slit structure 226. The lower end of each WL contact 240 can be in contact with top conductor layer or WL 206 in a respective level of staircase structure 212. Each local contact is filled with conductor materials including, but not limited to, W, Co, Cu, Al, silicides, or any combination thereof. Some or all of the local contacts can be formed simultaneously in a single contact forming process as described below in detail.

As shown in FIG. 2, in addition to the local contacts, 3D memory device 200 can further include a contact layer 242 and an interconnect layer 244 as part of its interconnect structures. Contact layer 242 can include a dielectric layer and a plurality of contacts 246 (e.g., vias) in the dielectric layer. Interconnect layer 244 can be formed on contact layer 242 and can include another dielectric layer and a plurality of interconnect contacts 248 (e.g., interconnect lines) in the dielectric layer. The local contacts, contacts 246 in contact layer 242, and interconnect contacts 248 in interconnect layer 244 can be collectively referred to herein as the interconnect structures of 3D memory device 200.

In some embodiments, each contact 246 can be filled with conductor materials including, but not limited to, W, Co, Cu, Al, silicides, or any combination thereof. All contacts 246 can be formed simultaneously in a single contact forming process as described below in detail.

In some embodiments, each interconnect contact 248 can be filled with conductor materials including, but not limited to, W, Co, Cu, Al, silicides, or any combination thereof. All interconnect contacts 248 can be formed simultaneously in a single contact formation process as described below in detail.

In some embodiments, interconnect contacts 248 in interconnect layer 244 can include bit lines 250, which are electrically connected to NAND strings 204, respectively, by corresponding contacts 246 and NAND string contacts 236. Bit lines 250 can be used to individually address a corresponding NAND string 204. Interconnect contacts 248 can further include source lines that are electrically connected to slit structures 226 (source contacts). Further, interconnect lines can be electrically connected to TACs 234 and to WL 206 in staircase structure 212 through respective contacts 246 and WL contacts 240. It is to be understood that the number of interconnect layers in 3D memory device 200 is not limited by the example in FIG. 2. Additional interconnect layer(s) with contacts can be formed to provide an interconnect network of structures for 3D memory device 200.

Figure 3:
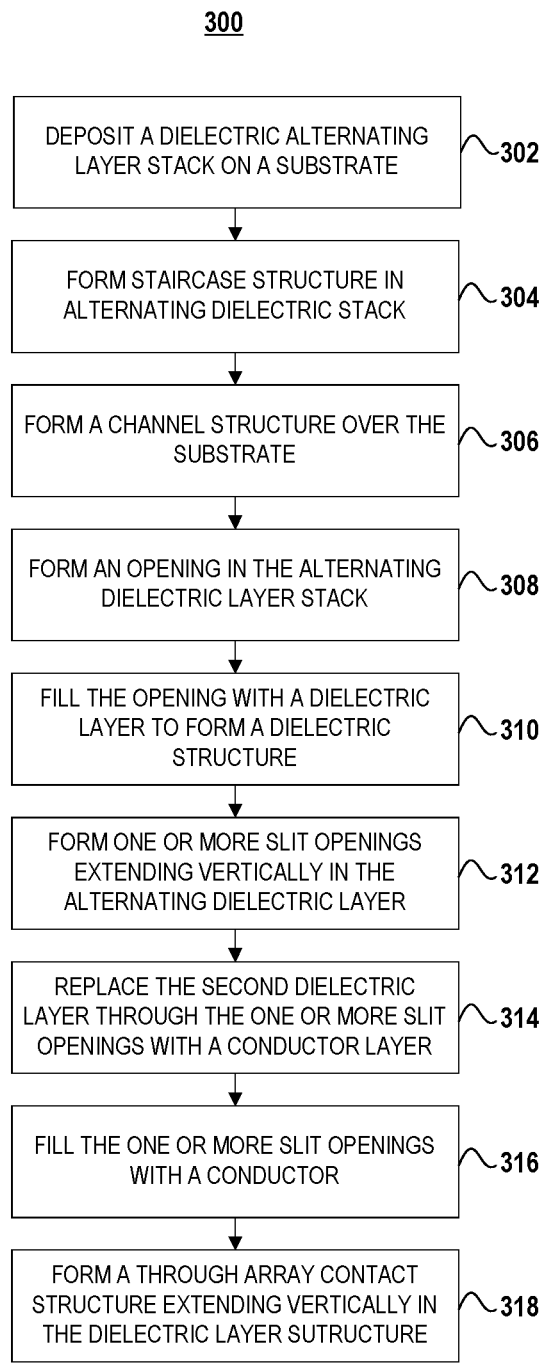
FIG. 3 is a flowchart of an exemplary method for forming a 3D memory device, according to some embodiments of the present disclosure.

FIG. 3 is a flowchart of an exemplary method 300 for forming a 3D memory device similar to 3D memory device 200, according to some embodiments of the present disclosure. FIGS. 4-13 will be used to describe the exemplary fabrication process for forming a 3D memory device using method 300. By way of example and not limitation, the 3D memory device fabricated with method 300 can be the 3D memory device 200 depicted in FIG. 2. It should be understood that the operations shown in method 300 are not exhaustive and that other operations can be performed before, after, or between any of the operations. For example, other operations may include wet clean operations, dry etch operations, photolithography operations, etc. Further, the sequence of the operations in method 300 is not limiting, and some operations may be performed concurrently or in a different order.

Figure 4:
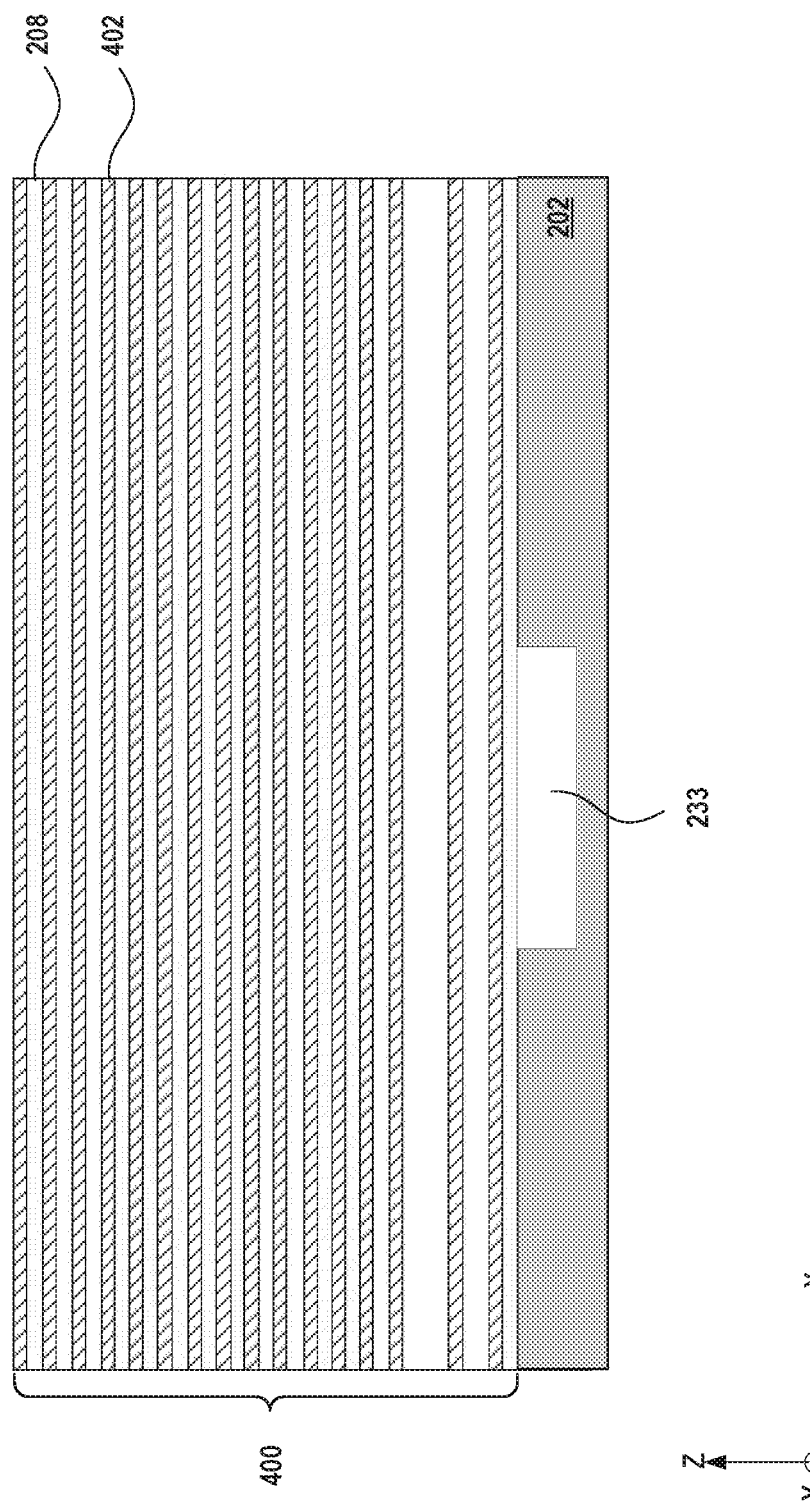
FIGS. 4-13 illustrate an exemplary fabrication process for forming a 3D memory device, according to some embodiments of the present disclosure.

Referring to FIG. 3 and FIG. 4, method 300 begins with operation 302, where an alternating dielectric stack 400 is disposed, or otherwise deposited, on a substrate 202. For example purposes, substrate 202 in method 300 will be described in the context of single crystalline Si. Based on the disclosure herein, other materials, as discussed above, can be used. These materials are within the spirit and scope of this disclosure. A plurality of first dielectric layer 208 and second dielectric layer 402 pairs can be formed on substrate 202 to form alternating dielectric stack 400. In some embodiments, each dielectric layer pair includes a $SiO_2$ layer and a SiN layer. For example, first dielectric layer 208 can be made of $SiO_2$ (same as dielectric layer 230 of alternating conductor/dielectric stack 210 of FIG. 2) and second dielectric layer 402 can be made of SiN. Alternating dielectric stack 400 can be formed by one or more thin-film deposition processes including, but not limited to, chemical vapor deposition (CVD), plasma-enhanced CVD (PECVD), physical vapor deposition (PVD), atomic layer deposition (ALD), plasma-enhanced ALD (PEALD), or any combination thereof. By way of example and not limitation, the height of dielectric stack 400 can range from about 4 μm to about 30 μm. In some embodiments, second dielectric layer 402 can be a sacrificial layer that will be replaced with a conductor in a subsequent operation so that alternating dielectric stack 400 can be converted to an alternating conductor/dielectric stack, similar to alternating conductor/dielectric stack 210 of FIG. 2.

According to some embodiments, substrate 202 includes isolation regions or structures, like STI structure 233 shown in FIG. 4. STI structure 233 in FIG. 4 can be formed on a top portion of substrate 202. By way of example, STI structure 233 can be formed prior to the formation of alternating dielectric stack 400. STI structures can be filled with a dielectric material, such as for example $SiO_2$.

Figure 5:
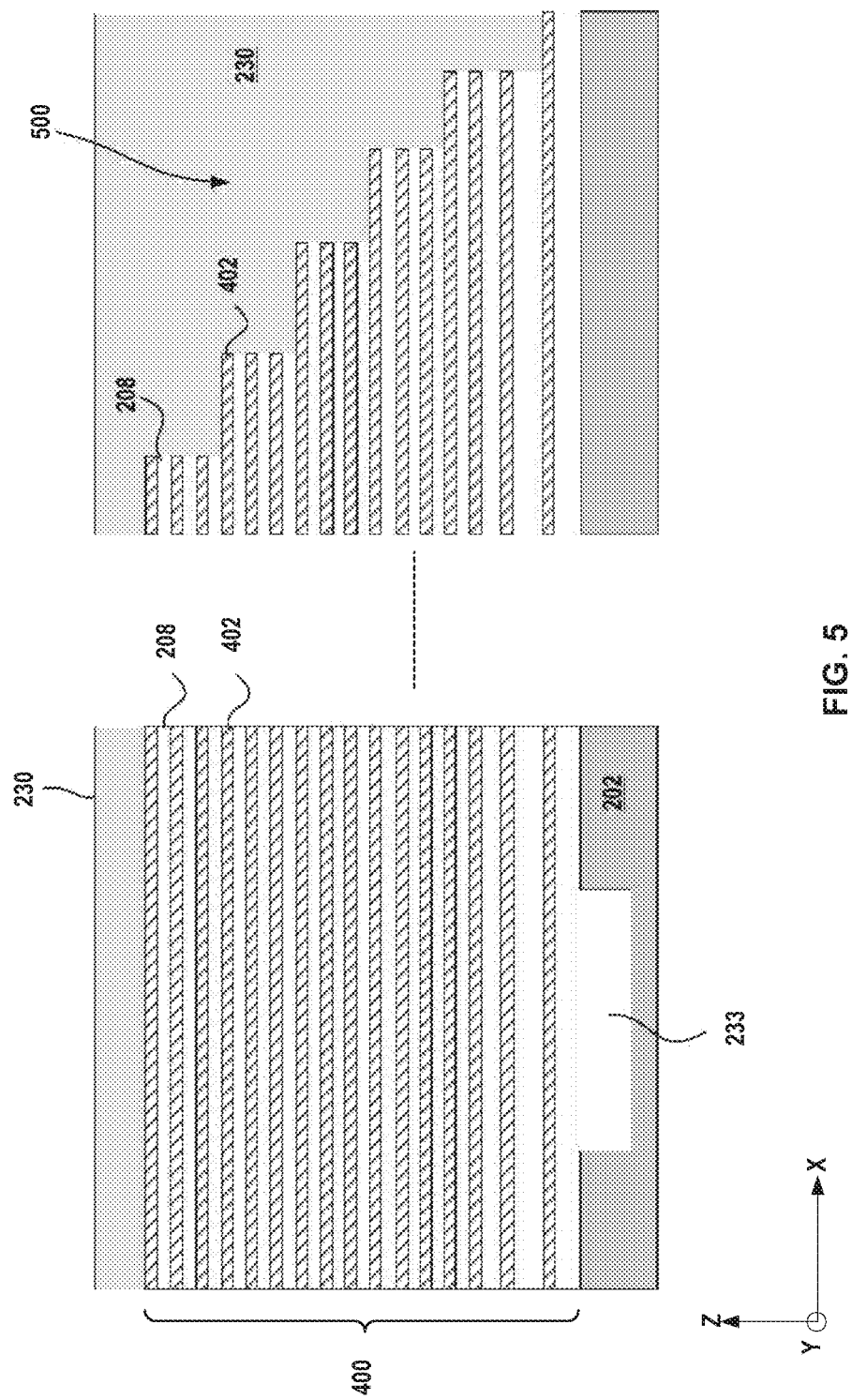

Method 300 continues with operation 304, as illustrated in FIG. 3, in which a staircase structure (like staircase structure 212 of FIG. 2) is formed from a portion of alternating dielectric stack 400. In some embodiments, a "trim-etch" process can be used on at least one side (in the lateral direction, x-direction) of alternating dielectric stack 400 to form a staircase structure with multiple levels (e.g., steps). By way of example and not limitation, a trim-etch process can be a multi-cycle process, where each cycle includes one or more photolithography operations followed by an etch operation. During the photolithography operations, a patterned photoresist (PR) layer masks a portion of dielectric stack 400. A subsequent first etch process removes a predetermined number of dielectric pairs from the exposed portion of dielectric stack 400 to form a first step (e.g., first level) in dielectric stack 400. The PR is then laterally trimmed (e.g., recessed in the x-direction) to expose an additional portion of dielectric stack 400. A subsequent second etch removes a predetermined number of dielectric pairs from the newly exposed dielectric stack 400 and the first step. Hence, a second step (e.g., second level) in dielectric stack 400 is formed. This step formation process continues in this fashion (e.g., a PR trim followed by an etch operation) until the desired number of steps in dielectric stack 400 is formed and the staircase structure is complete. As a result of this process, each level can include any desired number of dielectric layer pairs with alternating first dielectric layer 208 and second dielectric layer 402. After the staircase structure formation, the PR layer is removed (stripped) with a wet etch process. FIG. 5 shows the resulting staircase structure 500 made from alternating dielectric stack 400 according to the description of operation 304 of method 300.

In some embodiments, the etch process used in operation 304 can be a dry etch process that uses a single etch gas chemistry for both dielectric layers 208 and 402. Alternatively, the etch process used in operation 304 can use different etch chemistries for each dielectric layer. Further, depending on the selectivity of the etch chemistry, the etch process can be timed, end-pointed, or a combination thereof.

After the staircase structure formation, dielectric layer 230 is deposited over staircase structure 500 and dielectric stack 400. In some embodiments, a CMP or a dry etch process can be used to planarize the top surface of dielectric layer 230, as shown in FIG. 5. By way of example and not limitation, dielectric layer 230 can be $SiO_2$ deposited by PECVD, CVD, or another suitable deposition process. The thickness of dielectric layer 230 over alternating dielectric stack 400 can range from about 10 to about 1000 nm. In some embodiments, dielectric layer 230 is the same as dielectric layer 208 of dielectric stack 400, e.g., $SiO_2$.

Figure 6:
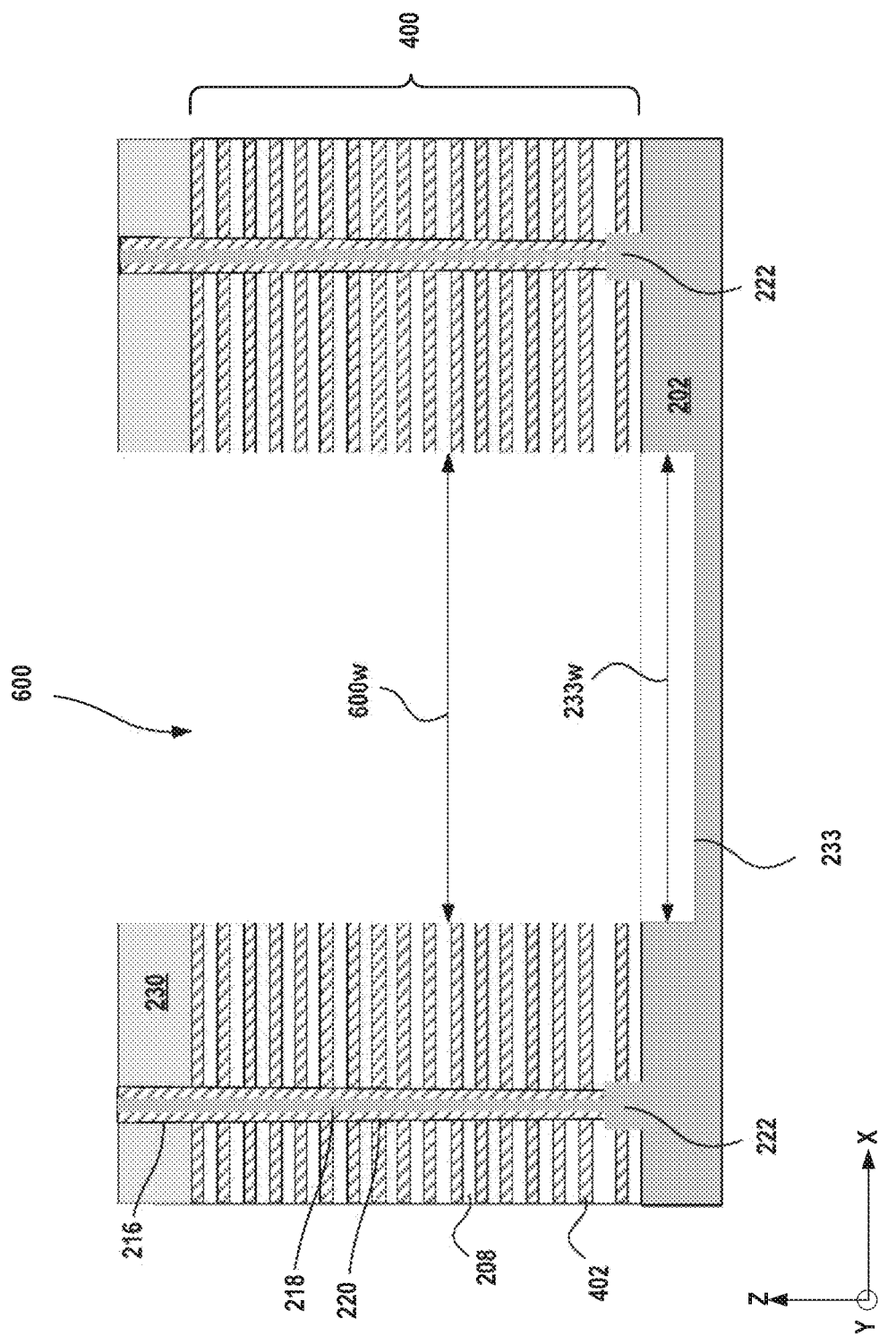

Method 300 continues with operation 306, as illustrated in FIG. 3, where a channel structure can be formed over substrate 202. However, this is not limiting and additional channel structures can be formed. Each channel structure can extend vertically through the alternating dielectric stack 400, as discussed earlier. Fabrication of each channel structure begins by etching a channel hole through dielectric layer 230 and alternating dielectric stack 400 until substrate 202 is exposed through the channel hole. Prior to filling the channel hole, an epitaxial plug 222 can be grown through the channel hole from substrate 202, as shown in FIG. 6. By way of example and not limitation, epitaxial plug 222 can be single crystalline Si. The height of epitaxial plug 222 can be controlled through the epitaxial growth process conditions. Channel structure 216 can be subsequently formed on epitaxial plug 222 by filling the channel hole.

By way of example and not limitation, a dry etch process can be used to form the channel hole. In some embodiments, the fabrication process of channel structure 216 further includes depositing memory film 220 and semiconductor channel 218 so that memory film 220 can be interposed between semiconductor channel 218 and the dielectric layer pairs 402 and 402 of alternating dielectric stack 400. Semiconductor channel 218 can include semiconductor materials, such as polysilicon. Memory film 220 can be a composite stack of dielectric layers including a combination of a tunneling layer, a storage layer, and a blocking layer (not individually shown in FIG. 6).

By way of example and not limitation, the tunneling layer can include dielectric materials such as $SiO_2$, SiN, SiON, or a combination thereof. Electrons or holes from the semiconductor channel can tunnel into a storage layer through the tunneling layer. The storage layer can include materials for storing charge. The storage layer materials include, but are not limited to, SiN, SiON, a combination of $SiO_2$ and SiN, or a combination thereof. The blocking layer can include a single dielectric material, such as $SiO_2$, or a stack of dielectric materials, such as $SiO_2/SiN/SiO_2$ (ONO). The blocking layer can further include a high-k dielectric, such as aluminum oxide ($Al_2O_3$). Semiconductor channel 218 and memory film 220 can be formed by one or more thin-film deposition processes, such as ALD, CVD, PEALD, PECVD, any other suitable deposition processes, or a combination thereof.

In some embodiments, dummy channel structures (not shown in FIGS. 4-13; e.g., dummy channel structures 122 in FIGS. 1A-1B) are formed simultaneously with channel structures 216. The dummy channel structures can extend vertically through the alternating layer stack and can be filled with the same materials as those in channel structures 216. However, local contacts are not formed on the dummy channel structures to provide electrical connections with other components of the 3D memory device. Thus, the dummy channel structures cannot be used for forming memory cells in the 3D memory device, i.e., they are not electrically functional or otherwise operational. In some embodiments, the dummy channel structures are used as structural elements.

Referring to FIG. 3, method 300 continues with operation 308 and the formation of an opening in the alternating dielectric layer stack. Formation of the opening involves etching portions of dielectric layer 230 and dielectric stack 400 until STI structure 233 of substrate 202 is exposed (e.g., through the etched portions of dielectric layer 230 and dielectric stack 400), as shown in FIG. 6. In other words, the opening can be formed so that it is aligned to STI structure 233. In some embodiments, the opening cannot expose an area beyond the STI structure 233. For example, the opening cannot expose STI structure 233 and a portion of substrate 202. However, the opening can expose a portion of STI structure 233. This can be accomplished via photolithography and etch methods (patterning). For example, photolithography can be used to form a patterned PR structure or a patterned hard mask (HM) (not shown in FIG. 6) over dielectric layer 230. The patterned PR structure or patterned HM can have an opening that exposes an area of dielectric layer 230. The opening in the patterned PR structure or patterned HM can be positioned so that it is over an area of the underlying STI structure 233. Areas of dielectric layer 230, where the formation of a dielectric structure is not desired, are covered by the patterned PR structure or patterned HM. A subsequent dry etch process removes the exposed portions of dielectric layer 230 and dielectric stack 400—e.g., through the openings in the patterned PR structure or patterned HM—until STI structure 233 of substrate 202 is exposed. In some embodiments, the dry etch process can be a multi-step, anisotropic etch that can be terminated (e.g., stopped) when STI structure 233 is exposed. By way of example and not limitation, the dry etch process can include the same or different etch chemistry for each layer (e.g., dielectric layer 230 and alternating dielectric stack 400). As a result of operation 308, an opening 600 with width 600$w$ is formed in dielectric stack 400 over STI structure 233, as shown in FIG. 6. As discussed above, width 600$w$ of opening 600 can be equal or shorter than width 233$w$ of STI structure 233 (e.g., 600$w$≤233$w$). In some embodiments, opening 600 may extend partially into STI structure 233. In other words, the etch process used to form opening 600 may also remove (recess) portion of the top surface of STI structure 233. It is noted that opening 600 shown in FIG. 6 can also extend in the y-direction (not shown in the view of FIG. 6) and its size can be defined by the patterned PR structure or patterned HM and the process conditions during the etch process. In any direction, the area of opening 600 can be equal or smaller than the area of STI structure 233, according to some embodiments. Additionally, multiple openings, like opening 600, can be formed concurrently during operation 306 of method 300 in other areas of dielectric stack 400. Further, each opening 600 can be formed over an STI structure 233. In some embodiments, the aspect ratio of opening 600 can range from about 0.1 to about 10.

In some embodiments, opening 600 can be formed concurrently with channel structure 216. In an alternative embodiment, opening 600 can be formed after the formation of channel structure 216, or before the formation of channel structure 216. Each of the aforementioned sequence of operations may require additional number of photolithography, etch, or deposition operations. After the formation of opening 600, the patterned PR structure or patterned HM can be removed (stripped) with a wet etch process.

Figure 7:
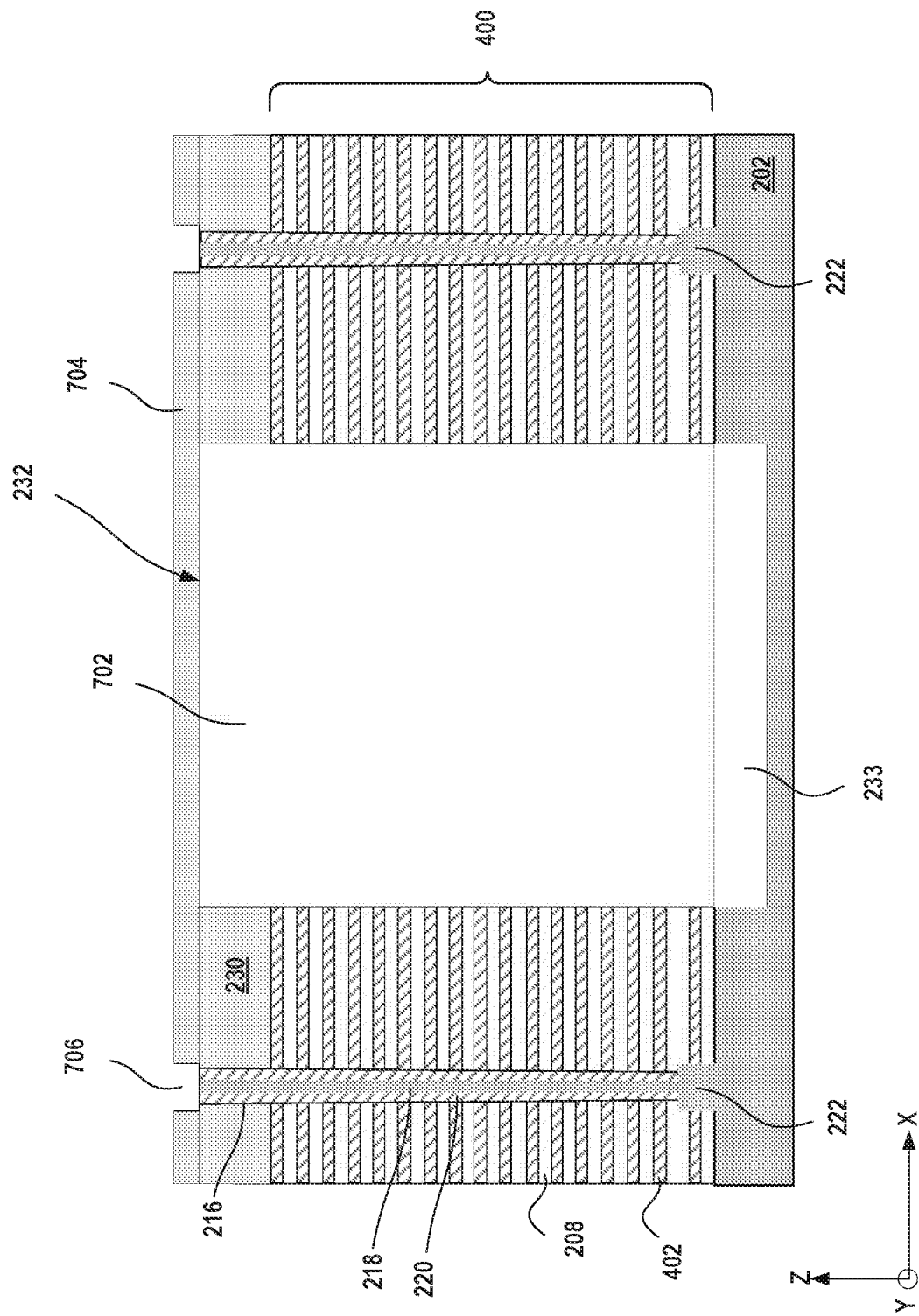

In referring to FIGS. 3 and 7, method 300 continues with operation 310, where opening 600 can be filled with a dielectric layer 702. In some embodiments, dielectric layer 702 includes a SiO$_2$ layer that can be deposited by a CVD, flowable CVD (FCVD), a PECVD process, or any other suitable process that can fill a high aspect ratio structure. By way of example and not limitation, dielectric layer 702 can be the same as dielectric layer 230, and/or first dielectric layer 208. A CMP process or a dry etch process can be used to planarize dielectric layer 702 so that the top surfaces of dielectric layer 230 and dielectric layer 702 are coplanar as shown in FIG. 7. As a result, dielectric structure 232 is formed in dielectric stack 400. In some embodiments, dielectric structure 232 defines the borders of TAC region 120 shown in FIGS. 1A-1C.

Figure 8:
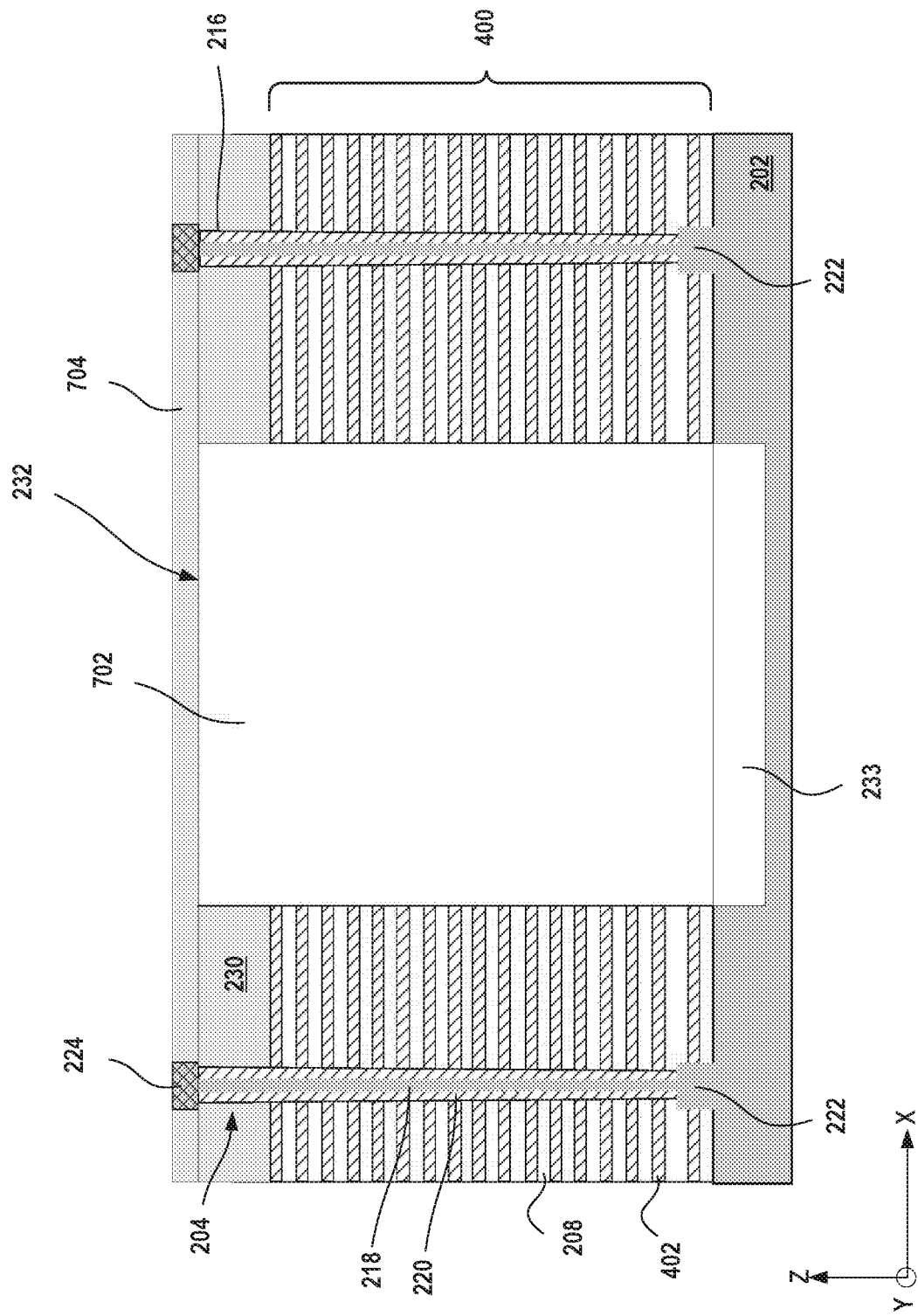

In some embodiments an etch stop layer is formed on the channel structures 216. For example a dielectric layer 704 can be deposited over dielectric layers 230 and 232 and be subsequently patterned to form plug openings 706 as shown in FIG. 7. Etch stop plug 224 can be subsequently formed on channel structures 216 by filling plug openings 708 using one or more thin-film deposition processes, such as ALD, CVD, PVD, any other suitable processes, or any combination thereof, as shown in FIG. 8. In some embodiments, polysilicon can be used to fill plug opening 706 followed by a CMP process to remove the excess polysilicon so that etch stop plug 224 can be coplanar with dielectric layer 704. In some embodiments, a metallic stack, such as Ti/TiN/W, can be deposited to fill plug opening 706, followed by a CMP process to make the top surface of etch stop plug 224 and dielectric layer 704 coplanar. In some embodiments, etch stop plug 224 can be sacrificial so that it can be replaced in a subsequent operation. For example, a sacrificial etch stop plug 224 can include an oxide instead of polysilicon or a metallic stack. A sacrificial etch stop plug 224 can be removed at a later operation and replaced with a "permanent" etch stop plug made of polysilicon or a metallic stack.

Figure 9:
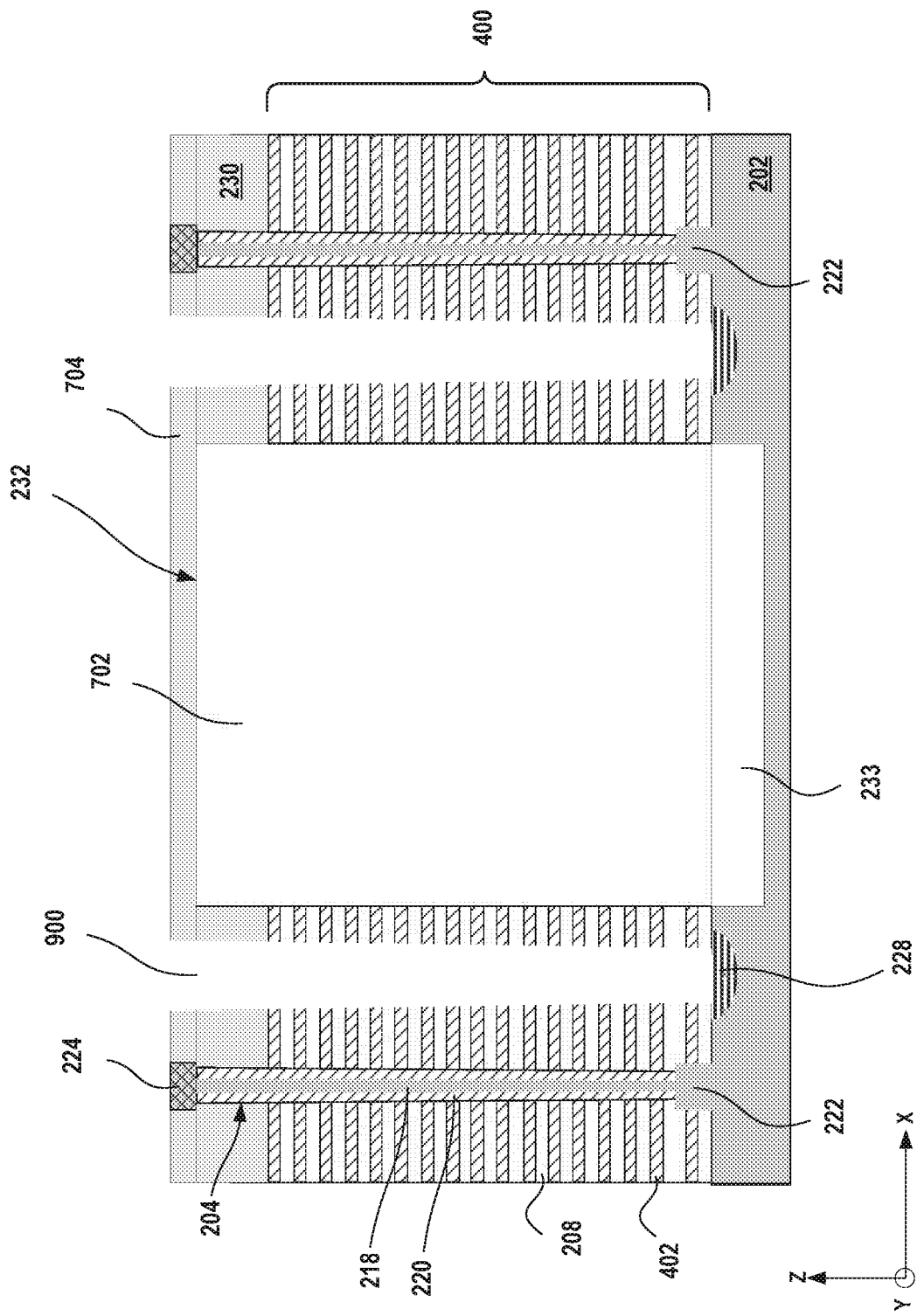

In operation 312 of method 300, as illustrated in FIG. 3, one or more slit openings can be formed in alternating dielectric stack 400. For example, slit opening 900 can be formed by dry etching dielectric layers 208 and 402 (e.g., SiO$_2$ and SiN) in dielectric stack 400, as shown in FIG. 9. In some embodiments, doped regions 228 can be subsequently formed in substrate 202 under each slit by, for example, ion implantation and thermal diffusion through the slits. Alternatively doped regions 228 can be formed during an earlier fabrication stage, for example, prior to the formation of dielectric stack 400, according to some embodiments.

Figure 10:
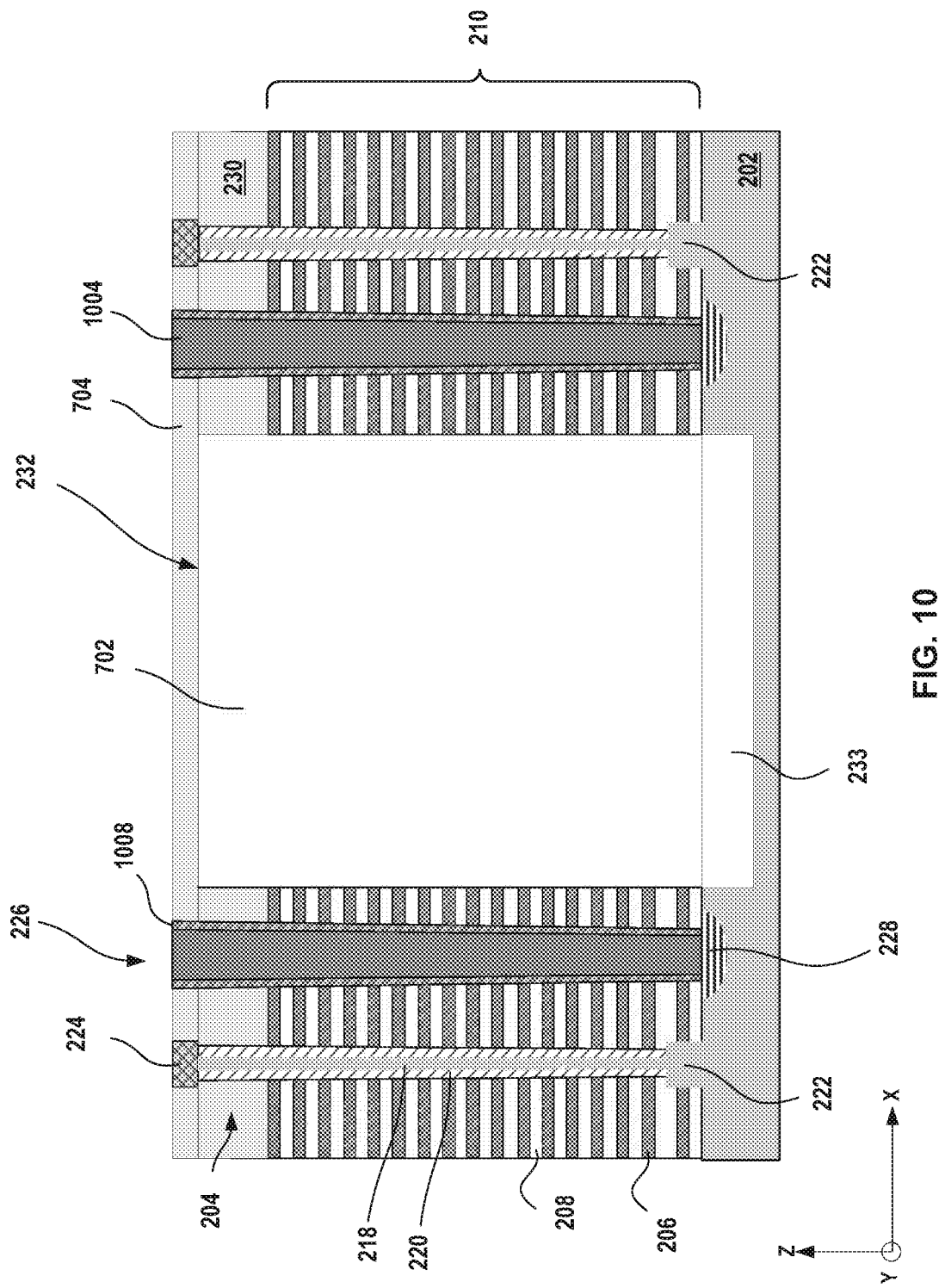

In operation 314 of method 300, slit openings 900, shown in FIG. 9, can be used for a "gate replacement" process (also known as the "WL replacement" process) in which second dielectric layers 402 (shown in FIG. 9; e.g., SiN) in stack 400 are replaced with conductor layers 206 (shown in FIG. 10; e.g., W). As a result, alternating dielectric stack 400 is converted to alternating conductor/dielectric stack 210 shown in FIG. 2.

The replacement of second dielectric layers 402 with conductor layers 206 can be achieved with the use of a wet etch process that is highly selective (e.g., with selectivity equal to, or greater than, 500:1) towards second dielectric layer 402 (e.g., SiN), in comparison to first dielectric layer 208 (e.g., SiO$_2$). By way of example and not limitation, the wet etch chemistry can include hot phosphoric acid (H$_3$PO$_4$). Since the wet etch chemistry is highly selective towards SiN, any layers or structures (including first dielectric layer 208 and dielectric structure 702) made of oxide (e.g., SiO$_2$) will not be etched or removed (i.e., will not be affected by the wet etch process).

Once second dielectric layers 402 are fully removed (e.g., etched), a conductive layer can be deposited by CVD, PECVD, ALD, PEALD, or combinations thereof to fill the space between first dielectric layers 208 through slit openings 900. As a result, conductor layers 206 can be formed between first dielectric layers 208 as shown in FIG. 10. By way of example and not limitation, the conductor materials can include W, Co, Cu, Al, polysilicon, silicides, or a combination thereof. In some embodiments, adhesion layers or barrier layers (not shown in FIG. 10) may also be deposited prior to the deposition of the conductor material. In some embodiments, conductive layers 206 can be deposited with a deposition—etch—deposition process to avoid partially filling slit openings 900 with the conductor material.

In operation 316 of method 300 shown in FIG. 3, the slit openings can be filled with a conductor material 1004 to form slit structures 226 as shown in FIG. 10. In some embodiments, conductor material 1004 can be the same as the conductor material in conductor layers 206. For example, slit structures 226 can be filed with W, Co, Cu, Al, polysilicon, silicides, or a combination thereof. In some embodiments, to electrically isolate conductor material 1004 of slit structure 226 from conductor layers 206, a dielectric layer 1008 (e.g., $SiO_2$) can be deposited therebetween. A CMP process can subsequent remove excess conductor material over dielectric layer 704 as shown in FIG. 10. The lower end of slit structure 226 can be in contact with doped region 228. In some embodiments, slit structure 226 can function as a source contact that is electrically connected to NAND string 204 through doped region 228 of substrate 202.

Figure 11:
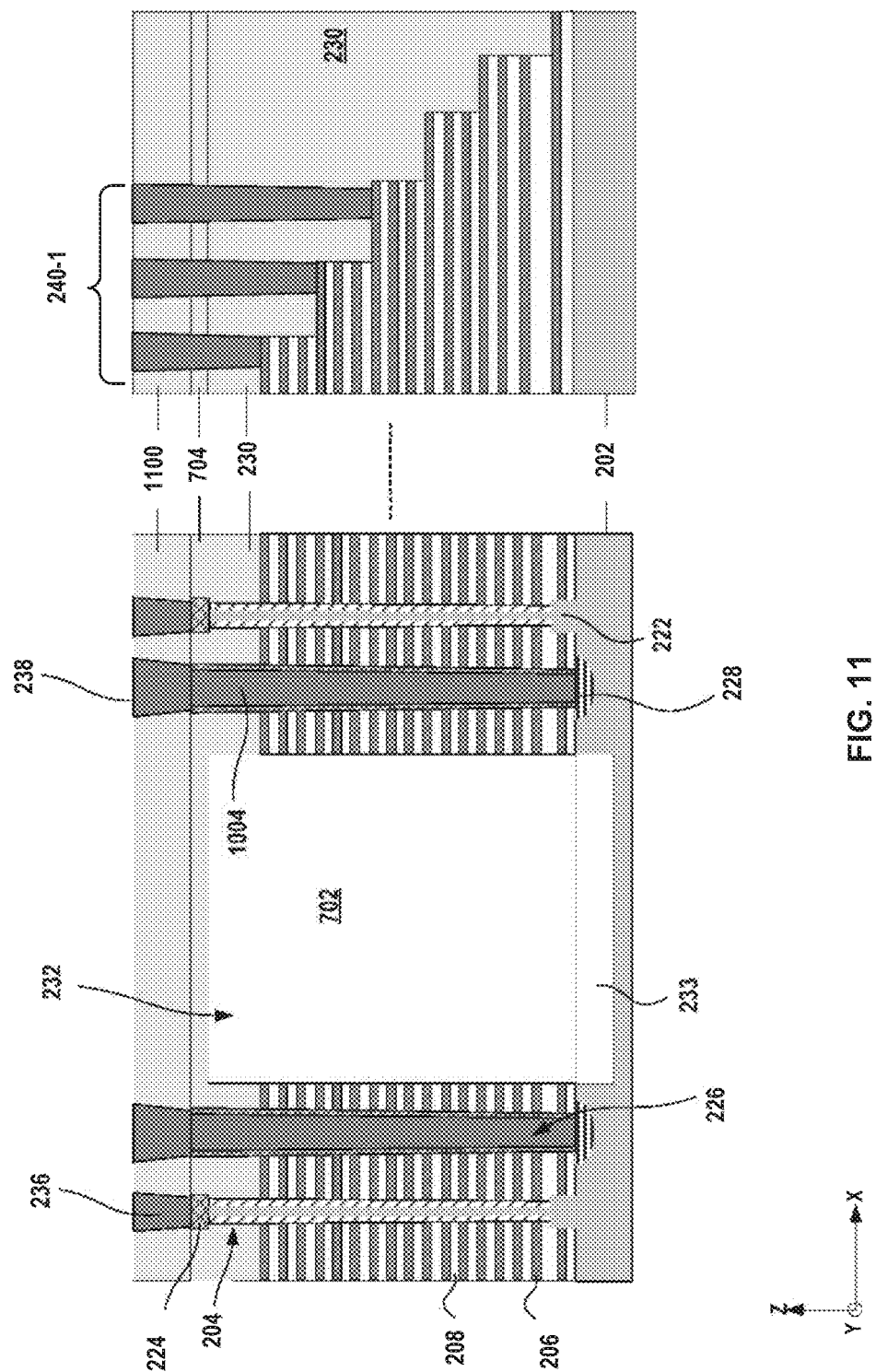

Referring to FIG. 11, a dielectric layer 1100 can be blanket deposited over dielectric layer 704 across substrate 202 so that local contacts can be formed in dielectric layer 1100. In some embodiments, the contact formation process can be divided into two separate photolithography/etch operations to accommodate the formation of contacts with different depths or heights. For example, the shortest local contacts (e.g., the NAND string contacts, the slit structure contacts, and the upper WL contacts of the staircase structure) can be formed first, and the tallest local contacts (e.g., the TACs and the lower WL contacts of the staircase structure) can be formed second. Merely for simplicity, the aforementioned shorter local contacts can be collectively referred to as first local contacts, and the aforementioned tallest local contacts can be collectively referred to as second local contacts.

Dielectric layer 1100 can be formed by one or more thin-film deposition processes, including ALD, CVD, PVD, any other suitable processes, or any combination thereof. Dielectric layer 1100 can include dielectric materials, including, but not limited to, $SiO_2$, SiN, SiON, or any combination thereof. First local contacts—such as NAND string contacts 236, slit structure contacts 238, and upper WL contacts 240-1—can be formed through dielectric layer 1100 by first etching vertical openings (e.g., with a dry etch), followed by filling the openings with conductor materials using ALD, CVD, PVD, any other suitable processes, or any combination thereof. By way of example and not limitation, the conductor materials used to fill the local contacts can include W, Co, Cu, Al, polysilicon, silicides, or a combination thereof. In some embodiments, prior to the conductor material fill, the openings can be filled with a barrier layer, an adhesion layer, and/or a seed layer. In some embodiments, prior to filing the openings, the oxide sacrificial etch stop plugs 224 can be replaced with permanent etch stop plugs made of polysilicon or a metallic stack, as discussed above.

Etching of dielectric layers to form the openings of first local contacts can be controlled via the "inherent" etch selectivity between the etched layer (e.g., a dielectric layer) and the underlying layer (a conductor, a nitride or oxide, etc.). For example, in the case of NAND string contacts 236, etch stop plug 224 filled with an oxide different from dielectric layer 1100 or a nitride can prevent further etching into NAND strings 204 during the formation of the first local contact openings. In the case of slit structure contacts 238 and upper WL contacts 240-1, further etching can be prevented due to the presence of conductor material 1004 and conductor layer 206, which can act as an etch stop layer for the dry etch process. As a result, formation of first local contacts with different heights can be possible.

A discussed earlier, first local contacts—such as NAND string contacts 236, slit structure contacts 238, and upper WL contacts 240-1—can be concurrently formed in the same contact forming process. The first local contact forming process can include multiple processes, for example, photolithography, etch, thin-film deposition, and CMP. In some embodiments, each process in the contact forming process can be performed only once for all the first local contacts. For example, a single lithography and etch process can be used to form all the openings of NAND string contacts 236, slit structure contacts 238, and upper WL contacts 240-1 and a single deposition process can be performed to fill all the openings of NAND string contacts 236, slit structure contacts 238, and upper WL contacts 240-1 with the same conductor materials. In some embodiments, a CMP process can remove excess deposited material from the top surface of dielectric layer 1100.

Figure 12:
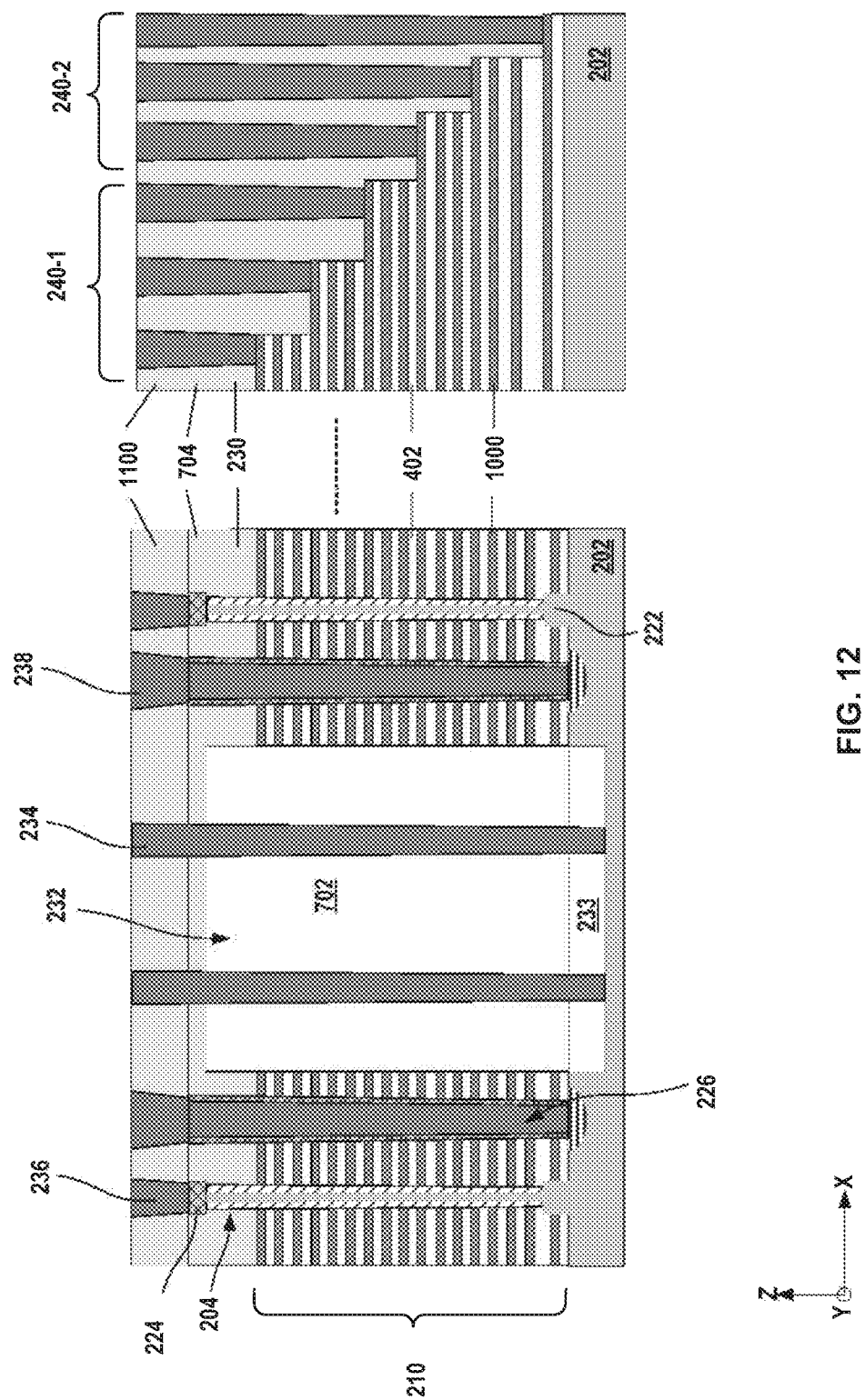

In Referring to FIG. 3 and method 300, the formation of the TAC structures (and the rest of the second local contacts) can be formed in operation 318. Referring to FIG. 12, and according to some embodiments, after forming the first set of local contacts (e.g., NAND string contacts 236, slit structure contacts 238, and upper WL contacts 240-1) a second set of local contacts can be formed, including TACs 234 and lower WL contacts 240-2 that are close to substrate 202. TACs 234 can be formed in dielectric layers 1100, 704, and 232—and lower WL contacts 240-2 can be formed in dielectric layers 1100, 704, and 230—by first etching vertical openings (e.g., by dry etching), followed by filling the openings with conductor materials using ALD, CVD, PVD, any other suitable processes, or any combination thereof. The conductor materials used for filling the local contacts can include, but are not limited to, W, Co, Cu, Al, polysilicon, silicides, or any combination thereof. In some embodiments, prior to the conductor material deposition, a barrier layer, an adhesion layer, and/or a seed layer can be formed.

TACs 234 can be formed by etching through the entire thickness of dielectric structure 702. Since both TACs 234 and lower WL contacts 240-2 are formed in oxide layers (e.g., dielectric layers 1100, 704, 232, and 230) the overall etching process can be simplified in terms of etching chemistry, etching process tooling, overall process integration, and cost. By way of example and not limitation, the openings for TACs 234 and lower WL contacts 240-2 can be formed by a deep reactive-ion etching (DRIE) process or with any other suitable anisotropic etch process. Forming TACs 234 in dielectric structure 232 can simplify the fabrication process and reduce the fabrication cost. This is because TACs 234 can be easily formed even after the gate replacement process together with the other local contacts in a common contact forming process.

In some embodiments, the lower end of TACs 234 can be formed in STI structure 233 and in contact with substrate 202, as shown in FIG. 12. For example, TACs 234 can extend through STI structure 233 and stop on substrate 202. The lower end of each lower WL contacts 240-2 can be in contact with the corresponding top conductor layer 206 (WL) of a corresponding level in the staircase structure, as shown in FIG. 12. The upper ends of all the local contacts (including both the first and second sets of local contacts) can be coplanar with one another at the top surface of dielectric layer 1100. The second set of local contacts (including TACs 234 and lower WL contacts 240-2) can be simultaneously formed in the same contact forming process after the formation of the first set of local contacts. That is, all the local contacts (including both the first and second sets of local contacts) can be formed in two contact forming processes as illustrated in FIGS. 11 and 12.

It is understood that in some embodiments, all the local contacts (including both the first and second sets of local contacts) can be simultaneously formed in a single contact forming process. That is, the two contact forming processes illustrated in FIGS. 11 and 12 can be combined into a single contact forming process. In some embodiments, each process in the contact forming process can be performed once for all of NAND string contacts 236, slit structure contacts 238, TACs 234, upper WL contacts 240-1, and lower WL contacts 240-2. For example, a single lithography process can be performed followed by a single etch process and a single deposition process.

Figure 13:
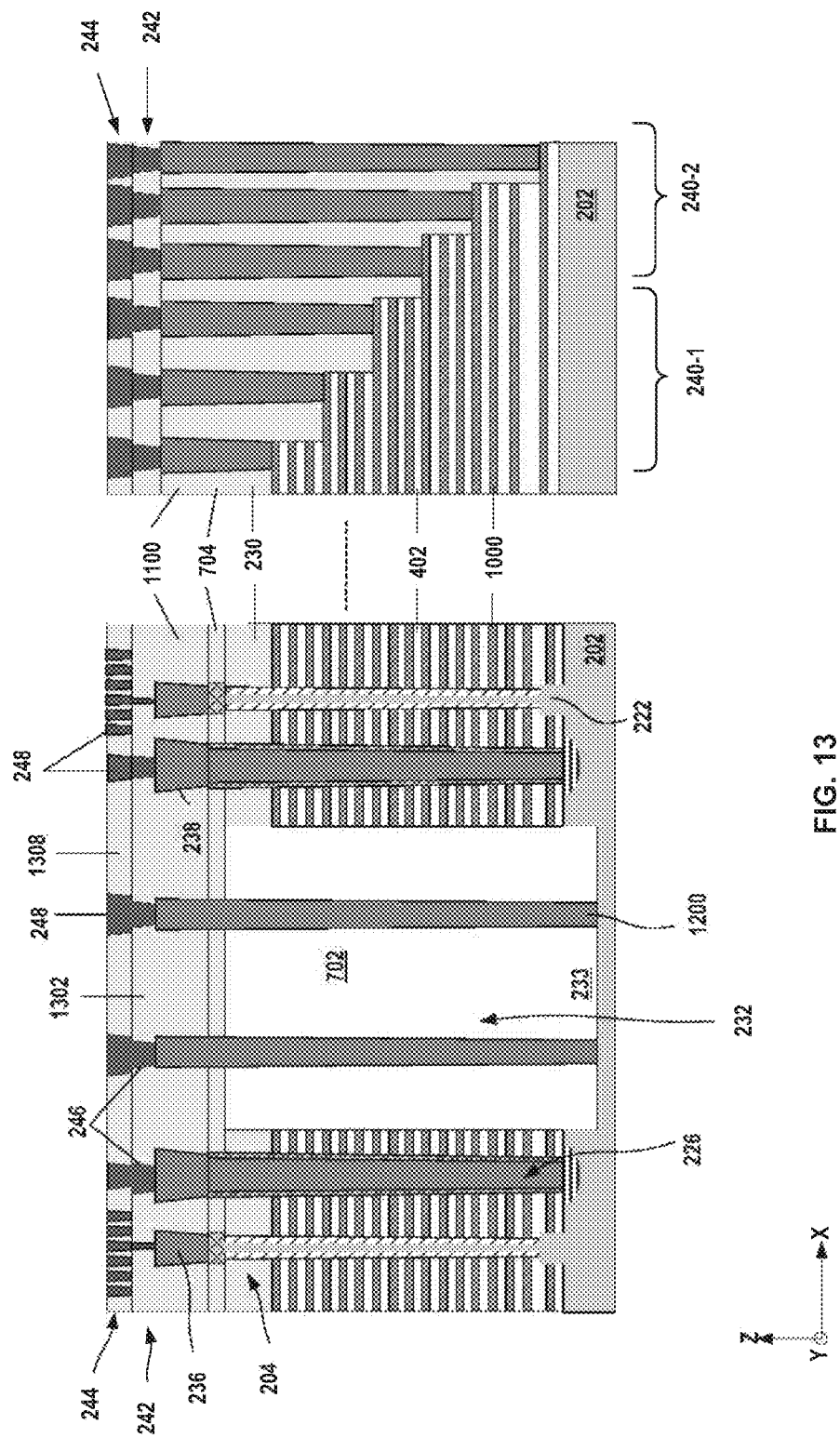

In some embodiments, an additional contact layer with a plurality of contacts can be formed over the local contacts. As illustrated in FIG. 13, contact layer 242 (including a dielectric layer 1302 and contacts 246) can be formed over dielectric layer 1100. Dielectric layer 1302 can be formed by one or more thin-film deposition processes, including ALD, CVD, PVD, any other suitable processes, or any combination thereof. Dielectric layer 1302 can include dielectric materials, including, but not limited to, $SiO_2$, SiN, SiON, or any combination thereof. Contacts 246 can be formed through dielectric layer 1302 by first etching vertical openings (e.g., using dry etch), followed by filling the openings with conductor materials using ALD, CVD, PVD, any other suitable processes, or any combination thereof. The conductor materials used to fill contacts 246 can include, but are not limited to, W, Co, Cu, Al, polysilicon, silicides, or any combination thereof. In some embodiments, prior to the conductor material deposition, a barrier layer, an adhesion layer, and/or a seed layer can be deposited in the contact opening.

As shown in FIG. 13, the lower end of each contact 246 can be in contact with the upper end of a corresponding local contact, for example, NAND string contact 236, slit structure contact 238, TAC 1200, or WL contacts 240-1 and 240-2. In some embodiments, all contacts 246 in contact layer 242 can be simultaneously formed in the same contact forming process. In some embodiments, each contact 246 of contact layer 242 is a via. Further, contact layer 242 can be referred to as the "Via0 (V0)" level/bottom level of the interconnect structures of 3D memory device 200.

Subsequently, a plurality of third contacts in an interconnect layer can be formed. As illustrated in FIG. 13, interconnect layer 244 (including a dielectric layer 1308 and interconnect contacts 248) can be formed above contact layer 242. Dielectric layer 1308 can be formed by one or more thin-film deposition processes, such as ALD, CVD, PVD, any other suitable processes, or any combination thereof. Dielectric layer 1308 can include dielectric materials, including, but not limited to, $SiO_2$, SiN, SiON, or any combination thereof. By way of example and not limitation, interconnect contacts 248 can be formed through dielectric layer 1308 by first etching vertical openings (e.g., with a dry etch process), followed by filling the openings with conductor materials using ALD, CVD, PVD, any other suitable processes, or any combination thereof. The conductor materials used to fill interconnect contacts 248 can include, but are not limited to, W, Co, Cu, Al, polysilicon, silicides, or any combination thereof. In some embodiments, prior to the conductor material deposition, a barrier layer, an adhesion layer, and/or a seed layer is formed.

As shown in FIG. 13, the lower end of each interconnect contact 248 can be in contact with the upper end of corresponding contact 246 in contact layer 242, so that each interconnect contact 248 can be electrically connected to a corresponding memory array structure, such as NAND strings 204, slit structures 226, and WLs 240-1 and 240-2. In some embodiments, all interconnect contacts 248 in interconnect layer 244 can be concurrently formed in the same contact forming process. In some embodiments, each interconnect contact 248 can be an interconnect line, and interconnect layer 244 can be referred to as the "Metal0 (M0)" level/bottom level of the interconnect structures of 3D memory device 200.

According to some embodiments, contacts 246 and interconnect contacts 248 can be formed in a single contact forming process, such as in a dual damascene process for forming Cu contacts. Nevertheless, as illustrated in FIG. 13, the interconnect structures including local contacts and contacts 246 and 248 can be formed in a limited number of fabrication steps to reduce the fabrication complexity and cost.

Various embodiments in accordance with the present disclosure provide a 3D memory device with interconnect structures for a memory array. The interconnect structures allow contacts for various memory array structures (e.g., NAND strings, gate line slits, WLs, etc.) to be fabricated in a limited number of operations (e.g., in a single operation or in two operations), thereby reducing the process complexity and manufacturing cost. In some embodiments, the interconnect structures disclosed herein can include bit lines in the top interconnect layer. These bit lines are suitable for 3D memory architectures in which the array device and the peripheral device are formed on different substrates and are subsequently joined by hybrid bonding in a face-to-face configuration.

Moreover, the interconnect structures disclosed herein include TACs for providing vertical interconnects between the stacked array device and peripheral device (e.g., for power bus and metal routing), thereby reducing the metal levels, improving the packing density and decrease the die size. In some embodiments, the TACs in the interconnect structures disclosed herein are formed in a dielectric structure that can be easily etched to form through holes therein compared to a stack of alternating dielectric layers or a stack of alternating conductor/dielectric layers. Therefore, fabrication complexity and cost can be reduced. The dielectric structure can be formed prior to the conversion of alternating layer stack of dielectrics to a conductor/dielectric layer stack.

In some embodiments, a 3D memory device includes a semiconductor substrate, an alternating layer stack disposed on the semiconductor substrate, and a dielectric structure, extending vertically through the alternating layer stack, on an isolation region of the substrate. Further, the alternating layer stack can abut a sidewall surface of the dielectric structure and the dielectric structure is formed of a dielectric material. The 3D memory device additionally can include one or more TACs that extend vertically through the dielectric and isolation region, and one or more channel structures that extend vertically through the alternating layer stack.

The 3D memory device further includes an epitaxial layer formed between each of the one or more channel structures and the semiconductor substrate, an etch stop plug disposed on each of the one or more channel structures, a staircase structure disposed in the alternating layer, and one or more contact layers disposed on the one or more TACs, channel structures, and slit structures.

In some embodiments, the dielectric structure abuts a sidewall surface of the TACs.

In some embodiments, the 3D memory device is a NAND 3D memory device.

In some embodiments, the alternating layer stack includes alternating pairs of a dielectric and conductor layers.

In some embodiments, the dielectric layer comprises silicon oxide and the conductor layer includes a metal.

In some embodiments, the conductor layers include a word line.

In some embodiments, the dielectric material is silicon oxide.

In some embodiment, the dielectric structure includes an oxide.

In some embodiment, the dielectric structure defines a through array contact region within the 3D memory device.

In some embodiments, an area of the dielectric structure is equal to or smaller than an area of the isolation region.

In some embodiments a method for forming 3D memory device includes forming an isolation structure on a substrate, disposing an alternating dielectric layer stack on the substrate, where the alternating dielectric layer stack includes pairs of a first dielectric layer and a second dielectric layer different from the first dielectric layer. The method further includes forming a channel structure extending vertically in the alternating dielectric layer, forming an opening in the alternating dielectric layer stack, where the opening exposes the isolation structure. The method also includes filling the opening with a dielectric layer to form a dielectric structure as a TAC region of the 3D memory device, removing portions of the dielectric structure and the isolation structure until the substrate is exposed to form a TAC opening that vertically extends through the dielectric structure and the isolation structure, and filling the TAC opening with a conductor to form a TAC structure in the TAC region, wherein the TAC structure is in contact with the substrate.

In some embodiments, before forming the TAC opening the method further includes forming slit openings that expose a doped region of the substrate by extending vertically in the alternating dielectric layer, replacing the second dielectric layer through the one or more slit openings with a conductor layer to convert the alternating dielectric layer stack to an alternating dielectric/conductor layer stack, and filling the one or more slit openings with a conductor to form one or more slit structures extending vertically in the alternating dielectric/conductor layer stack.

In some embodiments, before forming a channel structure, performing a trim-etch process to form a staircase structure in the alternating dielectric layer stack.

In some embodiment, removing portions of the alternating dielectric layer stack includes performing a dry etch process.

In some embodiments, filling the opening with the dielectric layer includes depositing the dielectric layer with a chemical vapor deposition, a plasma-enhanced chemical vapor deposition, or a physical vapor deposition process.

In some embodiments, filling the opening with the dielectric layer includes forming an oxide.

In some embodiments, filling the opening with the dielectric layer includes forming a silicon oxide.

In some embodiments, the first dielectric layer includes an oxide and the second dielectric layer comprises a nitride.

In some embodiments, the first dielectric layer includes a silicon oxide and the second dielectric layer comprises a silicon nitride.

In some embodiments a method for forming a 3D memory device includes disposing an alternating dielectric layer stack on a substrate, where the alternating dielectric layer stack includes pairs of a first dielectric layer and a second dielectric layer different from the first dielectric layer; forming channel structures extending vertically through the alternating dielectric layer; etching the alternating dielectric layer stack to form an opening, where the opening exposes an isolation region in the substrate; filling the opening with a dielectric layer to form a dielectric structure as a TAC region that is equal or smaller than the isolation region; etching through the dielectric structure and the isolation region to form TAC openings that expose the substrate; and filling the TAC openings with a conductor to form TAC structures in the TAC region.

In some embodiments a method for forming a 3D memory device further includes forming slit openings extending vertically through the alternating dielectric layer, where the slit openings expose a doped region of the substrate. The method further includes replacing the second dielectric layer through the slit openings with a conductor layer to convert the alternating dielectric layer stack to an alternating dielectric/conductor layer stack, filling the slit openings with a conductor to form slit structures, forming a staircase structure in the alternating dielectric layer stack, where the staircase structure comprises levels. Further the method includes, forming a world line contact on each of the levels of the staircase structure, forming local contacts over the channel and slit structures, and forming one or more contact layers over the local contacts, each word line, and each TAC structure.

In some embodiments, forming the opening in the alternating dielectric layer stack includes performing a dry etch process.

In some embodiments, the alternating dielectric/conductor layer stack abuts a sidewall of the dielectric structure.

In some embodiments, the dielectric structure abuts a sidewall surface of each TAC structure.

In some embodiments, a 3D memory device includes a substrate with an isolation structure; an alternating conductor/dielectric layer stack disposed on the substrate; a dielectric structure extending vertically through the alternating conductor/dielectric layer stack over the isolation structure, where the alternating conductor/dielectric layer stack abuts a sidewall surface of the dielectric structure and the dielectric structure is formed of a dielectric material; channel structures extending vertically through the alternating conductor/dielectric layer stack; and through array contacts extending vertically through the dielectric and the isolation structures.

In some embodiments, a 3D memory device further includes a staircase structure disposed in the alternating conductor/dielectric layer stack, where the staircase structures includes levels with each level having a conductor layer thereon; a word line contact disposed on each conductor layer of the staircase structure; and a local contact disposed on each channel structure and slit structure.

In some embodiments, the dielectric structure abuts a sidewall of the each TAC.

In some embodiments, the dielectric structure includes a through array contact region of the 3D memory device.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   an isolation structure formed in a substrate;
   an alternating layer stack on the substrate;
   a dielectric structure extending vertically through the alternating layer stack and in contact with a top surface of the isolation structure;
   a through array contact (TAC) extending vertically through the dielectric structure, wherein a bottom surface of the TAC is in contact with the isolation structure;
   a channel structure extending vertically through the alternating layer stack;
   an epitaxial layer under the channel structure;
   an etch stop plug on the channel structure;
   a staircase structure in the alternating layer stack;
   slit structures extending vertically in the alternating layer stack; and
   a contact layer on the TAC, the channel structure, and the slit structures.

2. The 3D memory device of claim 1, wherein the dielectric structure abuts a sidewall surface of the TAC.

3. The 3D memory device of claim 1, wherein the alternating layer stack comprises alternating pairs of a dielectric and a conductor layer.

4. The 3D memory device of claim 1, wherein the dielectric structure comprises silicon oxide.

5. The 3D memory device of claim 1, wherein the dielectric structure comprises an oxide material.

6. The 3D memory device of claim 1, wherein the dielectric structure defines a through array contact region within the 3D memory device.

7. The 3D memory device of claim 1, wherein a width of the dielectric structure is equal to or smaller than a width of the isolation structure.

8. A three-dimensional (3D) memory device, comprising:
   an alternating conductor/dielectric layer stack;
   a dielectric structure extending vertically through the alternating conductor/dielectric layer stack;
   first and second channel regions comprising first and second pluralities of channel structures, respectively;
   slit structures extending vertically through the alternating conductor/dielectric layer stack;
   a staircase structure disposed in the alternating conductor/dielectric layer stack, wherein the staircase structure comprises levels with each level having a conductor layer thereon;
   local contacts disposed on the first and second channel structures and the slit structures;
   a through array contact (TAC) region formed between the first and second channel regions, wherein the TAC region comprises a plurality of through array contacts (TACs) extending vertically through the dielectric structure; and
   a plurality of non-electrically functional channel structures surrounding the TAC region and between the first and second channel regions.

9. The 3D memory device of claim 8, wherein the dielectric structure abuts a sidewall of each TAC of the TACs.

10. The 3D memory device of claim 8, further comprising:
    a substrate;
    an etch stop plug interposed between each local contact of the local contacts and each channel structure of the first and second channel structures; and
    an epitaxial layer disposed between the substrate and the first or second channel structures.

11. The 3D memory device of claim 8, wherein the dielectric material comprises silicon oxide.

12. The 3D memory device of claim 8, wherein the TACs comprise a conductive material.

13. A method for forming a 3D memory device, the method comprising:
    disposing an isolation structure in a substrate;
    disposing an alternating dielectric layer stack on the substrate;
    disposing a staircase structure in the alternating dielectric layer stack, wherein the staircase structure comprises levels with each level having a conductor layer thereon;
    forming a channel structure extending vertically in the alternating dielectric layer stack;
    forming a first opening in the alternating dielectric layer stack, wherein the first opening exposes a top surface of the isolation structure;
    filling the first opening with a dielectric layer;
    removing portions of the dielectric structure to form a second opening that vertically extends through the dielectric structure, wherein the second opening exposes a portion of the isolation structure;
    filling the second opening with a conductor to form a through array contact (TAC) structure in contact with the portion of the isolation structure; and
    disposing a local contact on the channel structure and the TAC structure.

14. The method of claim 13, further comprising:
    forming slit openings extending vertically in the alternating dielectric layer stack, wherein the slit openings expose a doped region of the substrate;
    replacing a dielectric layer of the alternating dielectric layer stack through the slit openings with the conductor layer to convert the alternating dielectric layer stack to an alternating dielectric/conductor layer stack; and
    filling the slit openings with a conductor.

15. The method of claim 13, wherein filling the first opening with the dielectric layer comprises depositing the dielectric layer with a chemical vapor deposition, a plasma-enhanced chemical vapor deposition, or a physical vapor deposition process.

16. The method of claim 13, wherein filling the first opening with the dielectric layer comprises depositing an oxide material.

17. The method of claim 13, wherein disposing the alternating dielectric layer stack comprises alternatingly disposing a first dielectric layer comprising an oxide material and a second dielectric layer comprising a nitride material.

18. The 3D memory device of claim 1, further comprising a non-electrically functional channel structure between the channel structure and the TAC.

19. The 3D memory device of claim 8, further comprising an isolation structure, wherein bottom surfaces of the plurality of TACs are in contact with a top surface of the isolation structure.

20. The method of claim 13, further comprising forming a non-electrically functional channel structure between the channel structure and the TAC structure.

* * * * *